(12) United States Patent
Gong et al.

(10) Patent No.: US 11,393,853 B2
(45) Date of Patent: Jul. 19, 2022

(54) ARRAY SUBSTRATE AND MANUFACTURING METHOD THEREOF

(71) Applicants: Hefei BOE Optoelectronics Technology Co., Ltd., Anhui (CN); BOE Technology Group Co., Ltd., Beijing (CN)

(72) Inventors: Kui Gong, Beijing (CN); Biliang Dong, Beijing (CN); Xianxue Duan, Beijing (CN); Zhihai Zhang, Beijing (CN)

(73) Assignees: Hefei BOE Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/967,938

(22) PCT Filed: Dec. 18, 2019

(86) PCT No.: PCT/CN2019/126285
§ 371 (c)(1),
(2) Date: Aug. 6, 2020

(87) PCT Pub. No.: WO2020/192192
PCT Pub. Date: Oct. 1, 2020

(65) Prior Publication Data
US 2021/0257391 A1 Aug. 19, 2021

(30) Foreign Application Priority Data
Mar. 25, 2019 (CN) .......................... 201910228497.5

(51) Int. Cl.
*H01L 21/00* (2006.01)
*H01L 27/00* (2006.01)
(Continued)

(52) U.S. Cl.
CPC ........ *H01L 27/127* (2013.01); *H01L 27/1225* (2013.01); *H01L 27/1251* (2013.01);
(Continued)

(58) Field of Classification Search
CPC .............. H01L 21/77; H01L 21/02178; H01L 21/02244; H01L 21/02554;
(Continued)

(56) References Cited

U.S. PATENT DOCUMENTS 5,153,690 A * 10/1992 Tsukada ............ H01L 29/42384
257/61
9,012,259 B2 * 4/2015 Foncellino .......... H01L 51/0545
438/99
(Continued)

FOREIGN PATENT DOCUMENTS

CN 104362098 A 2/2015
CN 106298648 A 1/2017
(Continued)

OTHER PUBLICATIONS

Aug. 10, 2020—(CN) First Office Action Appn 201910228497.5 with English Translation.

*Primary Examiner* — Nikolay K Yushin
(74) *Attorney, Agent, or Firm* — Banner & Witcoff, Ltd.

(57) ABSTRACT

An array substrate and a manufacturing method thereof are disclosed. The method includes: forming a first thin film transistor which includes a first semiconductor layer, a first gate electrode, a first drain electrode and a first source electrode; forming a second thin film transistor which includes a second semiconductor layer, a second gate electrode, a second drain electrode and a second source electrode; and forming a dielectric layer which spaces the first semiconductor layer apart from the second semiconductor layer; the method further includes: processing the same layer
(Continued)

to form at least one selected from the group consisting of the first gate electrode, the first drain electrode and the first source electrode, at least one selected from the group consisting of the second gate electrode, the second drain electrode and the second source electrode, and the dielectric layer by the same layer.

16 Claims, 13 Drawing Sheets

(51) Int. Cl.
  *H01L 27/12* (2006.01)
  *H01L 21/02* (2006.01)
(52) U.S. Cl.
  CPC .... *H01L 27/1255* (2013.01); *H01L 21/02178* (2013.01); *H01L 21/02244* (2013.01); *H01L 27/1248* (2013.01)
(58) Field of Classification Search
  CPC ........... H01L 21/02814; H01L 27/1255; H01L 27/1251; H01L 27/1225; H01L 27/12; H01L 27/127; H01L 27/1248
  See application file for complete search history.

(56) References Cited

U.S. PATENT DOCUMENTS

| | | | |
|---|---|---|---|
| 9,093,542 B2* | 7/2015 | Maeda | H01L 27/1222 |
| 10,186,528 B2* | 1/2019 | Lee | H01L 27/1225 |
| 10,573,666 B2 | 2/2020 | Suzumura et al. | |
| 10,580,804 B2 | 3/2020 | Li et al. | |
| 2014/0183522 A1 | 7/2014 | Cha et al. | |
| 2014/0199807 A1* | 7/2014 | Foncellino | H01L 51/0005 438/99 |
| 2014/0319512 A1* | 10/2014 | Maeda | H01L 29/7869 257/43 |
| 2015/0243685 A1* | 8/2015 | Lee | H01L 29/78675 257/43 |
| 2016/0014402 A1 | 1/2016 | Lee et al. | |
| 2020/0091198 A1 | 3/2020 | Peng et al. | |
| 2021/0091120 A1* | 3/2021 | Xie | H01L 29/66969 |

FOREIGN PATENT DOCUMENTS

| | | |
|---|---|---|
| CN | 107275350 A | 10/2017 |
| CN | 107403806 A | 11/2017 |
| CN | 107910302 A | 4/2018 |
| CN | 109887936 A | 6/2019 |

* cited by examiner

ARRAY SUBSTRATE AND MANUFACTURING METHOD THEREOF

This application is a U.S. National Phase Entry of International Application No. PCT/CN2019/126285 filed on Dec. 18, 2019, designating the United States of America and claiming priority to Chinese Patent Application No. 201910228497.5, filed on Mar. 25, 2019. The present application claims priority to and the benefit of the above-identified applications and the above-identified applications are incorporated by reference herein in their entirety.

TECHNICAL FIELD

At least one embodiment of the present disclosure relates to an array substrate and a manufacturing method thereof.

BACKGROUND

A low-temperature poly-silicon thin film transistor (LTPS-TFT) has a high electron mobility and a fast response speed, and an oxide thin film transistor (Oxide-TFT) has a low leakage current. The technology (LTPO technology) of combining the LTPS-TFT with the Oxide-TFT in a driving circuit of a display device can combine the advantages of the two to achieve a better display effect. At present, the process of manufacturing a display substrate by LTPO technology is relatively complicated. For example, after forming the low-temperature poly-silicon thin film transistor, it is required to form a protection layer covering the low-temperature poly-silicon thin film transistor, and then an oxide thin film transistor is formed on the protection layer to prevent a heat treatment process in the subsequent procedure of manufacturing the oxide thin film transistor from affecting the performance of the low-temperature poly-silicon thin film transistor. Therefore, in the manufacturing procedure, the number of times of film forming processes and the number of times of patterning processes are relatively more, the process cost is high, and the production efficiency is low.

SUMMARY

At least one embodiment of the present disclosure provides a manufacturing method of an array substrate, which includes: forming a first thin film transistor, wherein the first thin film transistor includes a first semiconductor layer, a first gate electrode, a first drain electrode and a first source electrode; forming a second thin film transistor, wherein the second thin film transistor includes a second semiconductor layer, a second gate electrode, a second drain electrode and a second source electrode; and forming a dielectric layer, wherein the dielectric layer spaces the first semiconductor layer apart from the second semiconductor layer; the method further includes: processing a same layer to form at least one selected from a group consisting of the first gate electrode, the first drain electrode and the first source electrode, at least one selected from a group consisting of the second gate electrode, the second drain electrode and the second source electrode, and the dielectric layer by the same layer.

For example, in the manufacturing method of the array substrate provided by an embodiment of the present disclosure, the processing the same layer includes: providing a base substrate; forming a metal layer on the base substrate; forming a sacrifice layer on the metal layer, the metal layer including a first portion not covered by the sacrifice layer and a second portion covered by the sacrifice layer; performing a first oxidation treatment on the first portion of the metal layer so that the entire first portion of the metal layer is completely oxidized; removing the sacrifice layer; and performing a second oxidation treatment on the second portion of the metal layer, wherein in a direction perpendicular to the metal layer, a portion, away from the base substrate, of the second portion of the metal layer is oxidized, and a portion, close to the base substrate, of the second portion of the metal layer is not oxidized; a non-oxidized portion of the metal layer constitutes the first drain electrode, the first source electrode and the second gate electrode, and an oxidized portion of the metal layer constitutes the dielectric layer, or, the non-oxidized portion of the metal layer constitutes the first gate electrode and the second gate electrode, and the oxidized portion of the metal layer constitutes the dielectric layer.

For example, in the manufacturing method of the array substrate provided by an embodiment of the present disclosure, the dielectric layer is further configured as a gate insulation layer insulating the second semiconductor layer from the second gate electrode.

For example, in the manufacturing method of the array substrate provided by an embodiment of the present disclosure, the processing the same layer includes: providing a base substrate; forming a metal layer on the base substrate; forming a sacrifice layer on the metal layer, the metal layer including a first portion not covered by the sacrifice layer and a second portion covered by the sacrifice layer; performing a first oxidation treatment on the first portion of the metal layer to allow the entire first portion of the metal layer to be completely oxidized; removing the sacrifice layer; and performing a second oxidation treatment on the second portion of the metal layer, in which in a direction perpendicular to the metal layer, a portion, away from the base substrate, of the second portion of the metal layer is oxidized, and at least a part of a portion, close to the base substrate, of the second portion of the metal layer is not oxidized; the non-oxidized portion of the metal layer constitutes the first source electrode, the first drain electrode, the second source electrode and the second drain electrode, and the oxidized portion of the metal layer constitutes the dielectric layer, or, the non-oxidized portion of the metal layer constitutes the first gate electrode, the second source electrode and the second drain electrode, and the oxidized portion of the metal layer constitutes the dielectric layer.

For example, in the manufacturing method of the array substrate provided by an embodiment of the present disclosure, the processing the same layer includes: providing a base substrate; forming a metal layer on the base substrate; forming a sacrifice layer on the metal layer, the metal layer including a first portion not covered by the sacrifice layer and a second portion covered by the sacrifice layer; performing a first oxidation treatment on the first portion of the metal layer to allow the entire first portion of the metal layer to be completely oxidized; the sacrifice layer includes a first portion and a second portion, the first portion of the sacrifice layer covers a portion of the second portion of the metal layer for forming the first source electrode and the first drain electrode, the second portion of the sacrifice layer covers a portion, for forming the second source electrode and the second drain electrode, of the second portion of the metal layer, and a thickness of the first portion of the sacrifice layer in a direction perpendicular to the base substrate is less than a thickness of the second portion of the sacrifice layer in the direction perpendicular to the base substrate; the manufacturing method of the array substrate further includes: removing the first portion of the sacrifice layer and retaining at least a part of the second portion of the sacrifice layer after completing the first oxidation treatment; and performing a second oxidation treatment on the portion, for forming the first source electrode and the first drain electrode, of the second portion of the metal layer, in which in a direction perpendicular to the metal layer, a part, away from the base substrate, of the portion, for forming the first source electrode and the first drain electrode, of the second portion of the metal layer is oxidized, a part, close to the base substrate, of the portion, for forming the first source electrode and the first drain electrode, of the second portion of the metal layer is not oxidized; the non-oxidized portion of the metal layer constitutes the first drain electrode and the first source electrode, the portion of the metal layer covered by the second portion of the sacrifice layer during the second oxidation treatment constitutes the second drain electrode and the second source electrode, and the oxidized portion of the metal layer constitutes the dielectric layer, or, the non-oxidized portion of the metal layer constitutes the second gate electrode, the portion, covered by the second portion of the sacrifice layer during the second oxidation treatment, of the metal layer constitutes the second drain electrode and the second source electrode, and the oxidized portion of the metal layer constitutes the dielectric layer.

For example, the manufacturing method of the array substrate provided by an embodiment of the present disclosure further includes: forming the second semiconductor layer on the dielectric layer after removing the second portion of the sacrifice layer, in which a surface, facing the dielectric layer, of the second semiconductor layer is in direct contact with the second drain electrode and the second source electrode.

For example, in the manufacturing method of the array substrate provided by an embodiment of the present disclosure, a method of the first oxidation treatment includes at least one selected from the group consisting of an in-air annealing process, a plasma oxidation process, an anodic oxidation process and an ion implantation process, and a method of the second oxidation treatment is the ion implantation process.

For example, in the manufacturing method of the array substrate provided by an embodiment of the present disclosure, a material of the metal layer includes an elemental metal, and a material of the dielectric layer includes an oxide of the elemental metal.

For example, in the manufacturing method of the array substrate provided by an embodiment of the present disclosure, the elemental metal is aluminum, and the metal oxide is aluminum oxide.

For example, in the manufacturing method of the array substrate provided by an embodiment of the present disclosure, a thickness of the metal layer in a direction perpendicular to the base substrate is in a range of 200 nm to 1000 nm, and the dielectric layer is transparent and insulated.

For example, in the manufacturing method of the array substrate provided by an embodiment of the present disclosure, a material of the first semiconductor layer is polysilicon, and a material of the second semiconductor layer is a metal oxide.

For example, in the manufacturing method of the array substrate provided by an embodiment of the present disclosure, the array substrate includes: an operation region, including a plurality of operation units arranged in an array, in which each of the plurality of operation units includes an operation driving circuit; and a peripheral region, located at a periphery of the operation region, in which the peripheral region is provided with a peripheral driving circuit, and the peripheral driving circuit is configured to drive the operation driving circuit; the peripheral driving circuit includes the first thin film transistor, the operation driving circuit includes the second thin film transistor, and the second thin film transistor is configured to control an operation of each of the plurality of operation units; or, the operation driving circuit includes the first thin film transistor and the second thin film transistor, and one selected from a group consisting of the first drain electrode and the first source electrode is electrically connected to the second gate electrode.

For example, in the manufacturing method of the array substrate provided by an embodiment of the present disclosure, the operation driving circuit further includes: a storage capacitor, wherein the storage capacitor includes a first plate and a second plate that are opposite to each other, and the first plate is electrically connected with the second drain electrode; the same layer is processed to form the first plate, the second source electrode and the second drain electrode by using the same layer.

At least one embodiment of the present disclosure further provides an array substrate, and the array substrate includes: a first thin film transistor, a second thin film transistor, and a dielectric layer. The first thin film transistor includes a first semiconductor layer, a first gate electrode, a first drain electrode and a first source electrode; the second thin film transistor, including a second semiconductor layer, a second gate electrode, a second drain electrode, and a second source electrode; and the dielectric layer spaces the first semiconductor layer apart from the second semiconductor layer and covers at least one selected from the group consisting of the first gate electrode, the first drain electrode and the first source electrode, and at least one selected from the group consisting of the second gate electrode, the second drain electrode and the second source electrode in a direction perpendicular to the dielectric layer; at least one selected from the group consisting of the first gate electrode, the first drain electrode and the first source electrode, and at least one selected from the group consisting of the second gate electrode, the second drain electrode and the second source electrode are disposed in a same layer, both of a material of the at least one selected from the group consisting of the first gate electrode, the first drain electrode and the first source electrode and a material of the at least one selected from the group consisting of the second gate electrode, the second drain electrode and the second source electrode are a first materials, and a material of the dielectric layer is an oxide of the first material.

For example, in the array substrate provided by an embodiment of the present disclosure, the dielectric layer is further configured as a gate insulation layer insulating the second gate electrode from the second semiconductor layer.

For example, in the array substrate provided by an embodiment of the present disclosure, the first material includes an elemental metal, and the material of the dielectric layer is an oxide of the elemental metal.

For example, the array substrate provided by an embodiment of the present disclosure further includes: a first insulation layer located between the first semiconductor layer and the dielectric layer, and the dielectric layer is in direct contact with the first insulation layer.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
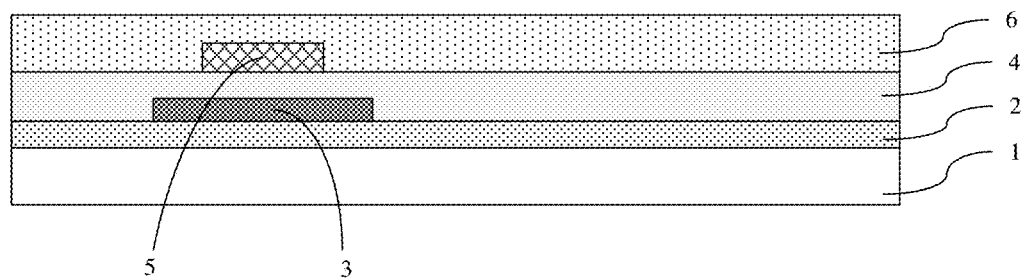
FIGS. 1A-1G are schematic diagrams of a manufacturing method of an array substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive operation, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "Inside," "outside," "on," "under" and the like are only used to indicate relative position relationship, and when the absolute position of the object which is described is changed, the relative position relationship may be changed accordingly.

The accompanying drawings in the present disclosure are not strictly drawn according to actual scale, the number of thin film transistors in the display panel is not limited to the number shown in the accompanying drawings, and the specific dimension and number of each structure can be determined according to actual needs. The accompanying drawings in the present disclosure are only schematic structural diagrams.

At least one embodiment of the present disclosure provides a manufacturing method of an array substrate, and the manufacturing method includes: forming a first thin film transistor, in which the first thin film transistor includes a first semiconductor layer, a first gate electrode, a first drain electrode and a first source electrode; forming a second thin film transistor, in which the second thin film transistor includes a second semiconductor layer, a second gate electrode, a second drain electrode and a second source electrode; and forming a dielectric layer, in which the dielectric layer spaces the first semiconductor layer apart from the second semiconductor layer; the method further includes: processing a same layer to form at least one selected from a group consisting of the first gate electrode, the first drain electrode and the first source electrode, at least one selected from a group consisting of the second gate electrode, the second drain electrode and the second source electrode, and the dielectric layer by the same layer.

Exemplarily, FIGS. 1A-1G are schematic diagrams of a manufacturing method of an array substrate provided by an embodiment of the present disclosure, and the manufacturing method shown in the schematic diagrams includes the following steps.

The manufacturing method of the array substrate includes forming a first thin film transistor, and forming the first thin film transistor includes forming a first semiconductor layer and a first gate electrode. As shown in FIG. 1A, a base substrate 1 is provided. For example, the base substrate 1 is a quartz substrate, a glass substrate, or a flexible substrate, etc. For example, the manufacturing method of the array substrate includes forming a buffer layer 2 on the base substrate 1 to prevent impurities on the base substrate 1 from entering the thin film transistor(s) formed subsequently. A material of the buffer layer 2 is, for example, an inorganic insulated material, such as silicon oxide, silicon nitride or silicon oxynitride, etc. Then, a first semiconductor layer 3 of the first thin film transistor is formed on the buffer layer 2, and for example, a material of the first semiconductor layer 3 is low-temperature poly-silicon. Next, a first gate insulation layer 4 covering the first semiconductor layer 3 is formed, and a first gate electrode 5 is formed on the first gate insulation layer 4. The manufacturing method of the array substrate further includes: forming a first insulation layer 6, in which the first insulation layer 6 covers the first gate electrode 5 and the first semiconductor layer 3. For example, a material of the first insulation layer 6 includes at least one selected from a group consisting of silicon nitride and silicon oxide. For example, after forming a first insulated material film (not shown) for forming the first insulation layer 6, an activation treatment and a hydrogenation treatment are performed on the first insulated material film at a high temperature, and for example, the activation treatment is performed at 600 degrees Celsius for 1-3 minutes and then the hydrogenation treatment is performed at 380-420 degrees Celsius for 30 minutes, so as to finally obtain the first insulation layer 6. The specific process of forming the low-temperature poly-silicon thin film transistor and the specific methods of forming the buffer layer 2, the first semiconductor layer 3, the first gate insulation layer 4 and the first gate electrode 5 can be referred to conventional techniques.

Figure 1B:
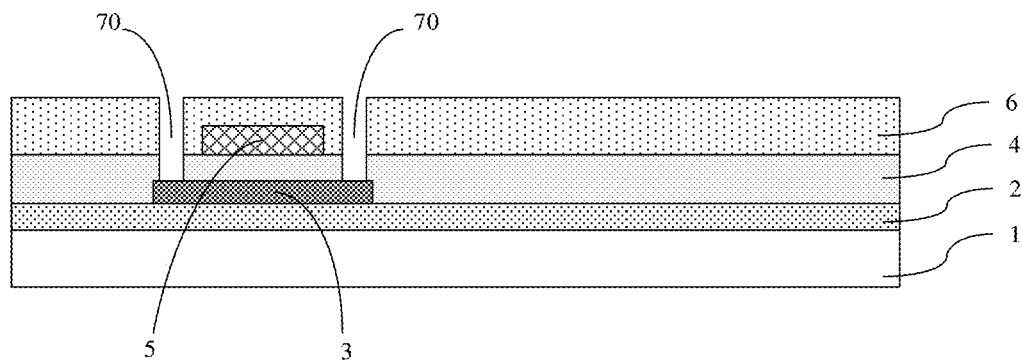

For example, the forming the first thin film transistor further includes forming a first drain electrode and a first source electrode. As shown in FIG. 1B, first via holes 70 are formed in the first gate insulation layer 4 and the first insulation layer 6 by a patterning process, and the first via holes 70 expose a part of the first semiconductor layer 3. For example, the patterning process is a photolithography process.

Figure 1C:
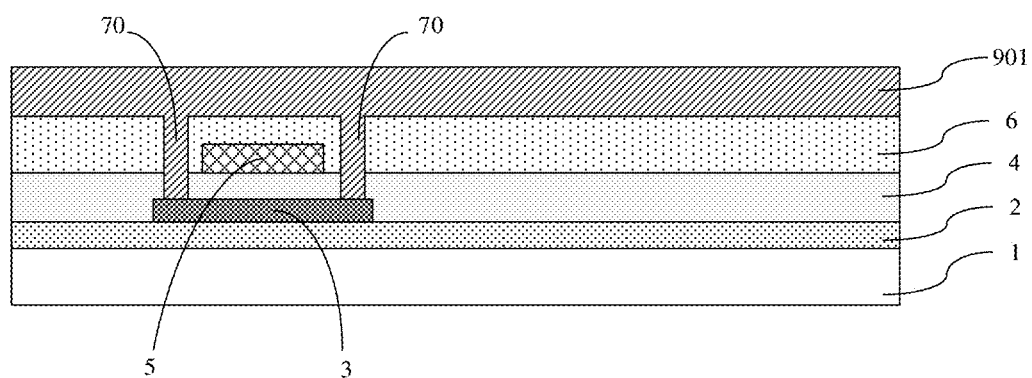

As shown in FIG. 1C, a metal layer 901 is formed on the substrate 1, and the metal layer 901 is in contact with the first semiconductor layer 3 through the first via holes 70. For example, a material of the metal layer 901 includes an elemental metal. The elemental metal is, for example, aluminum. The following steps are described by taking the case that the material of the metal layer 901 is aluminum as an example. Of course, the elemental metal is not limited to aluminum, and may be, for example, zinc, tin, tantalum, titanium, etc. For example, the metal layer 901 is formed by a method of deposition, evaporation, magnetron sputtering, etc.

Figure 1D:
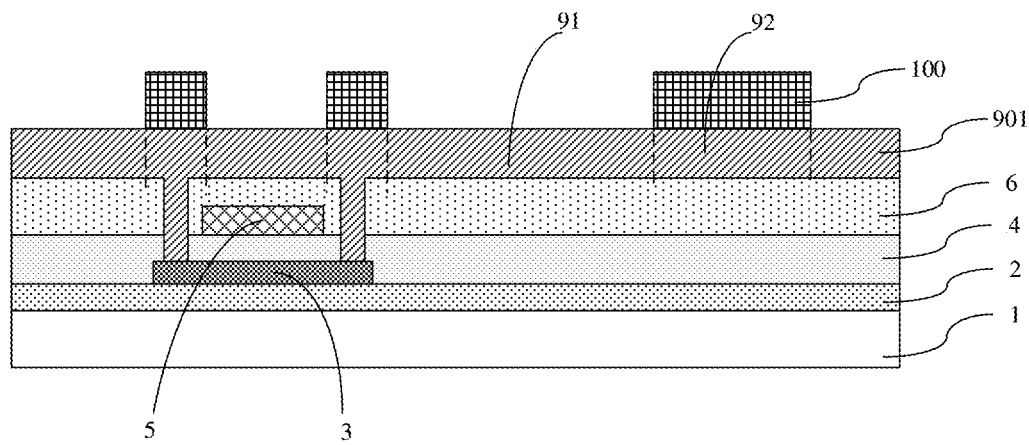

As shown in FIG. 1D, a sacrifice layer 100 is formed on the metal layer 901, and the metal layer 901 includes a first portion 91 not covered by the sacrifice layer 100 and a second portion 92 covered by the sacrifice layer 100. For example, a material of the sacrifice layer 100 is a photoresist material. For example, the forming the sacrifice layer 100 includes forming a photoresist layer (not shown) covering the metal layer 901, and performing a photolithography process on the photoresist layer to form the sacrifice layer 100. Moreover, the photoresist is easy to be peeled off and is easy to be removed afterwards. Of course, the material of the sacrifice layer 100 is not limited to the photoresist material, and the material of the sacrifice layer 100 may be any other material that is easy to be peeled off.

Figure 1E:
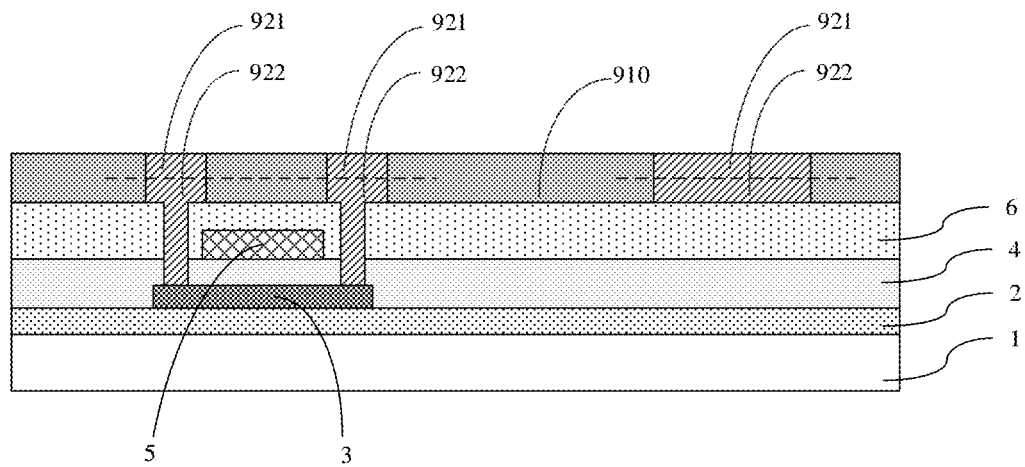

Then, a first oxidation treatment is performed on the first portion 91 of the metal layer to allow the entire first portion 91 of the metal layer to be completely oxidized, thereby obtaining the oxidized first portion 910 of the metal layer as shown in FIG. 1E. For example, in the case where the material of the metal layer 901 is aluminum, a material of the oxidized first portion 91 of the metal layer is aluminum oxide ($Al_2O_3$). The complete oxidation of the entire first portion 91 of the metal layer is realized by controlling the reaction rate and reaction time of the first oxidation treatment. In contrast, the second portion 92 of the metal layer covered by the sacrifice layer 100 is not oxidized because of protection by the sacrifice layer 100.

For example, a method of the first oxidation treatment includes at least one selected from a group consisting of an in-air annealing process, a plasma oxidation process, an anodic oxidation process and an ion implantation process. For example, the first portion 91 of the metal layer is oxidized by using a plasma oxidation process. The metal layer is treated with $O_2$ in a plasma state to completely oxidize the first portion 91 of the metal layer, and for example, metal Al is oxidized into $Al_2O_3$. For example, the first portion 91 of the metal layer is oxidized using an anodic oxidation process. For example, metal aluminum is used as an anode, graphite or metal platinum is used as a cathode, a constant voltage power supply or a constant current power supply is connected between the anode and the cathode, both the anode and the cathode are immersed in an electrolyte solution, and the electrolyte solution is, for example, a weakly acidic solution or a weakly alkaline solution, such as citric acid solution, ammonium tartrate solution and the like. After electrifying the anode and the cathode, an electrochemical reaction at the anode is $2Al+3H_2O \rightarrow Al_2O_3+6e^-+6H^+$, and an electrochemical reaction at the cathode is $6H_2O+6e^- \rightarrow 3H_2+6OH^-$, and it can be seen that the reaction at the anode is a metal oxidation reaction. The anodic oxidation process can be performed at normal temperature, is easy to be realized, does not need high-cost equipment capable of providing a high-temperature condition, thereby reducing the cost; moreover, the structure of the array substrate in the embodiments of the disclosure can be manufactured on a flexible substrate which is not resistant to high temperature, and the anodic oxidation process is suitable for flexible display technology. For another example, the first portion 91 of the metal layer is oxidized using a plasma implantation process. Active oxygen ions are accelerated (e.g., an oxygen ion electron beam is formed), and oxygen ions that obtain a large kinetic energy are implanted into the first portion 91 of the metal layer to form an insulated oxide, and for example, the active oxygen ions are implanted into the metal Al to form $Al_2O_3$. In the plasma implantation process, for example, the energy range of the oxygen ions is 6-10 keV, the current range of the oxygen ion electron beams is (6-9)±10% uA/cm, and the number of times of scanning is 3-5, so as to ensure that the first portion 91 of the metal layer can be fully oxidized.

After the first oxidation treatment is performed on the first portion 91 of the metal layer, the sacrifice layer 100 is removed to obtain a structure as shown in FIG. 1E, and for example, the sacrifice layer 100 is peeled off. Then, a second oxidation treatment is performed on the second portion 92 of the metal layer, and in a direction perpendicular to the metal layer 901, a portion 921, away from the base substrate is oxidized, of the second portion 92 of the metal layer is oxidized, and a portion 922, close to the base substrate, of the second portion 92 of the metal layer is not oxidized. For example, the second oxidation treatment is performed on the second portion 92 of the metal layer by using the in-air annealing process, the plasma oxidation process, the anodic oxidation process or the ion implantation process that are described above. The thickness of the oxidized portion of the second portion 92 of the metal layer in the direction perpendicular to the base substrate 1, i.e., the thickness of the portion 921, away from the base substrate 1, of the second portion 92 of the metal layer in the direction perpendicular to the base substrate 1, is controlled by controlling conditions of the process such as the chemical reaction rate and the reaction time, the particle implantation depth, etc., so that the portion 922, close to the base substrate, of the second portion 92 of the metal layer is not oxidized. For example, in one embodiment, the method of the second oxidation treatment is an ion implantation process. In the second oxidation process, the thickness of the oxidized portion of the second portion of the metal layer in the direction perpendicular to the base substrate 1 needs to be controlled, which requires a relatively high precision control of oxidation. Compared with other methods, the thickness of the oxidized portion of the second portion of the metal layer in the direction perpendicular to the base substrate 1 can be controlled more precisely by the second oxidation process using the ion implantation process.

Figure 1F:
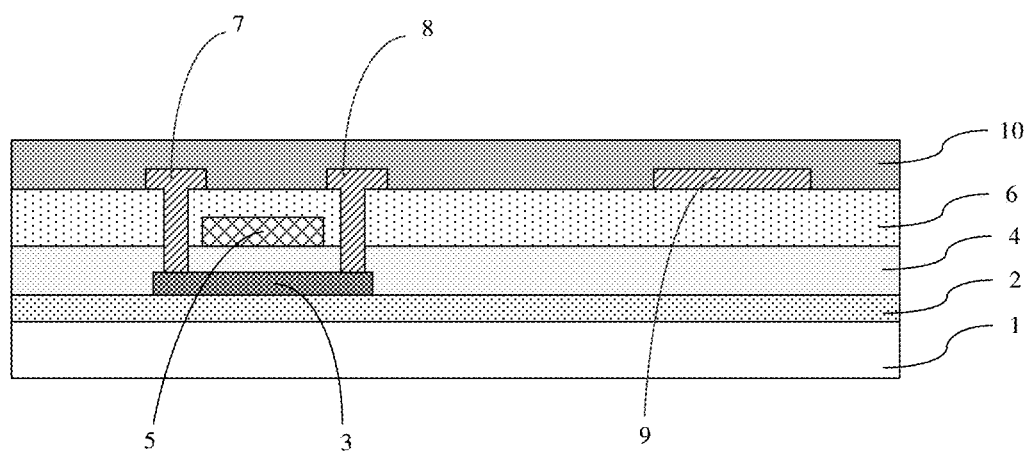

Therefore, as shown in FIG. 1F, the non-oxidized portion of the metal layer 901 constitutes a first drain electrode 7, a first source electrode 8, and a second gate electrode 9 of the second thin film transistor, thereby forming a first thin film transistor 101; the oxidized portion of the metal layer 901 (including the oxidized first portion 910 of the metal layer and the oxidized portion 921, layer away from the base substrate, of the second portion 92 of the metal) constitutes the dielectric layer 10, that is, the first drain electrode 7, the first source electrode 8, the second gate electrode 9 and the dielectric layer 10 are formed by the same layer (the metal layer 901), thereby reducing the number of times of film formation and the number of times of patterning, and simplifying the manufacturing procedure of the array substrate.

The dielectric layer 10 includes an oxide of an elemental metal. For example, the dielectric layer 10 is transparent and insulated. For example, in the case where the material of the metal layer 901 is aluminum, the oxide of the elemental metal is aluminum oxide. A transparent film with a good light transmittance can be formed by aluminum oxide, that is, the dielectric layer 10 has a good light transmittance, so that the array substrate provided by the embodiments of the disclosure has a good light transmittance, which is favorable to improve the light transmittance of a display device in the case where the array substrate is applied to the display device; and the property of aluminum oxide processes is stable, is insulated and has a strong ability of barrier to hydrogen and oxygen. The dielectric layer 10 formed of aluminum oxide is easy to be prepared and has low material cost. Of course, the metal layer 901 may be formed of other metal, and accordingly, the material of the dielectric layer 10 is an oxide of the metal.

For example, the thickness of the metal layer 901 in the direction perpendicular to the base substrate 1 is in a range of 200 nm to 1000 nm. In this case, it can not only be ensured that the thickness of the metal layer 901 is sufficient to obtain the dielectric layer 10 and the electrodes (the first drain electrode, the first source electrode and the second gate electrode) by the second oxidation process, but also be ensured that the dielectric layer 10 is transparent.

Figure 1G:
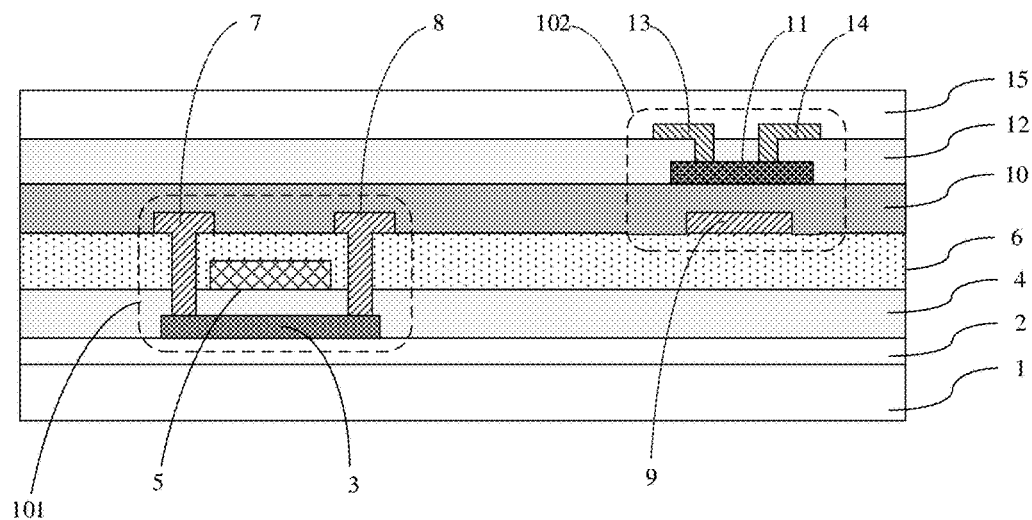

Next, as shown in FIG. 1G, a second semiconductor layer 11 and a second insulation layer 12 are formed on the dielectric layer 10, second via holes are formed in the second insulation layer 12 by a patterning process, and a second drain electrode 13 and a second source electrode 14 that are in contact with the second semiconductor layer 11 through the second via holes are formed on the second insulation layer 12, thereby forming a second thin film transistor 102. Then, a passivation layer 15 covering the second thin film transistor 102 is formed. For example, a material of the second semiconductor layer 11 is an oxide, such as a metal oxide, that is, the second semiconductor layer 11 is an oxide semiconductor layer. The metal oxide is, for example, indium gallium zinc oxide (IGZO). A specific method of forming the oxide semiconductor layer can be referred to conventional techniques. For example, in general, it is necessary to perform a heat treatment on the oxide semiconductor layer to reduce or eliminate lattice defects. The dielectric layer 10 is located between the first semiconductor layer 3 and the second semiconductor layer 11 to space the first semiconductor layer 3 apart from the second semiconductor layer 11, so that the dielectric layer 10 made of the transparent metal oxide material can better prevent hydrogen in the first semiconductor layer 3 (the low-temperature poly-silicon semiconductor layer after being performed by the hydrogenation treatment) of the first thin film transistor 101 from diffusing into the second semiconductor layer 11 of the second thin film transistor 102, and at the same time, the dielectric layer 10 can prevent hydrogen and oxygen in the second semiconductor layer 11 (oxide semiconductor layer) from entering the first semiconductor layer 3 during the heat treatment of the second semiconductor layer 11 to affect the low-temperature poly-silicon semiconductor layer, thus improving the performance of the array substrate and the display quality of the display device adopting the array substrate. Therefore, the manufacturing method of the array substrate provided by the embodiments of the present disclosure simplifies the manufacturing process while achieving the advantages of both the low-temperature poly-silicon thin film transistor and the oxide thin film transistor and preventing the adverse effects on the performances of each other caused by the respective manufacturing processes of the two kinds of transistors.

For example, in the embodiment shown in FIGS. 1A-1G, the material of the first insulation layer 6 is silicon nitride or silicon oxide (e.g., silicon dioxide). Because silicon nitride and silicon oxide can better block the migration of hydrogen ions and oxygen ions, so as to better prevent hydrogen and oxygen in the first semiconductor layer 3 from entering the second semiconductor layer 11, and at the same time, to prevent hydrogen and oxygen in the second semiconductor layer 11 from entering the first semiconductor layer 3 during the heat treatment process of the second semiconductor layer 11.

It should be noted that in another embodiment, the first semiconductor layer 3 is an oxide semiconductor layer and the second semiconductor layer 11 is a low-temperature poly-silicon semiconductor layer. In this case, the manufacturing method of the array substrate provided by the embodiments of the present disclosure can also achieve the above technical effects.

In the embodiment shown in FIGS. 1A-1G, the dielectric layer 10 is further configured as a second gate insulation layer insulating the second semiconductor layer 11 from the second gate electrode 9, thereby omitting the step of individually manufacturing the second gate insulation layer and further simplifying the manufacturing process of the array substrate.

Figure 2A:
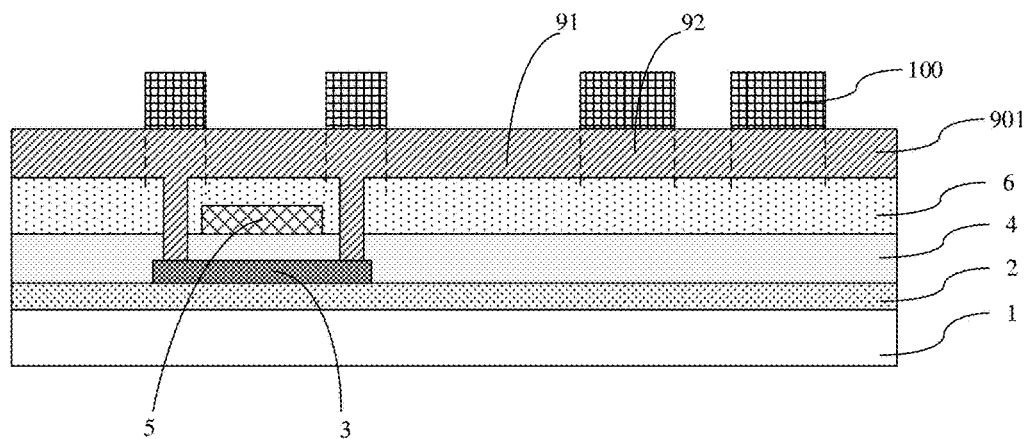
FIGS. 2A-2E are schematic diagrams of another manufacturing method of an array substrate provided by an embodiment of the present disclosure.

FIGS. 2A-2E are schematic diagrams of another manufacturing method of an array substrate provided by an embodiment of the present disclosure. In this embodiment, after performing the steps shown in FIGS. 1A-1C, as shown in FIG. 2A, a sacrifice layer 100 is formed on a metal layer 901, and the metal layer includes a first portion 91 not covered by the sacrifice layer 100 and a second portion 92 covered by the sacrifice layer 100. The pattern of the sacrifice layer 100 is different from that in the embodiment shown in FIG. 1D. The second portion 92 of the metal layer shown in FIG. 2A is used to subsequently form a first drain electrode, a first source electrode, a second drain electrode, a second source electrode, and a portion of a dielectric layer.

Figure 2B:
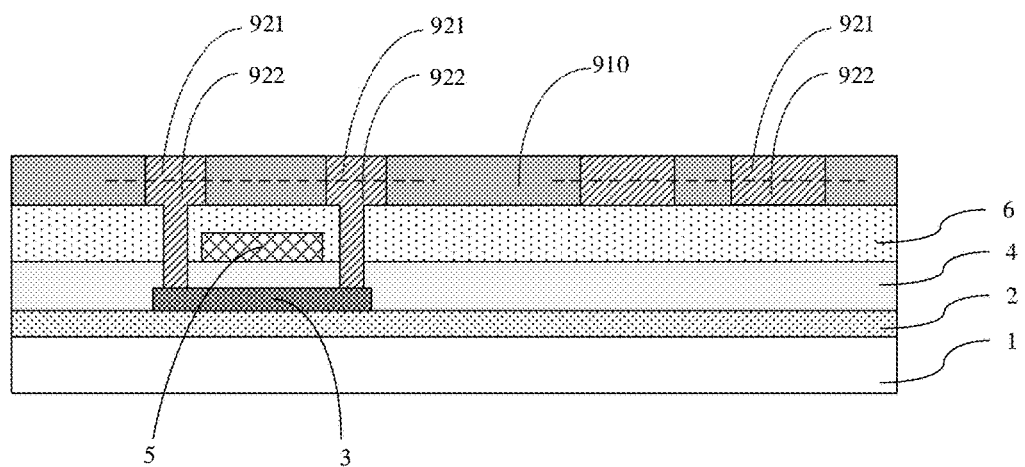

Then, a first oxidation treatment is performed on the first portion 91 of the metal layer to allow the entire first portion 91 of the metal layer to be completely oxidized, thereby obtaining the oxidized first portion 910 of the metal layer as shown in FIG. 2B. The second portion 92 of the metal layer covered by the sacrifice layer 100 is not oxidized because of protection by the sacrifice layer 100. The material of the metal layer and the specific method of the first oxidation treatment are the same as those in the above embodiments.

After the first oxidation treatment is performed on the first portion 91 of the metal layer, the sacrifice layer 100 is removed to obtain a structure as shown in FIG. 2B, and for example, the sacrifice layer 100 is peeled off. Then, a second oxidation treatment is performed on the second portion 92 of the metal layer, and in a direction perpendicular to the metal layer 901, a portion 921, away from the base substrate, of the second portion 92 of the metal layer is oxidized, and a portion 922, close to the base substrate, of the second portion 92 of the metal layer is not oxidized. The method of the second oxidation treatment is the same as that in the above embodiments.

Figure 2C:
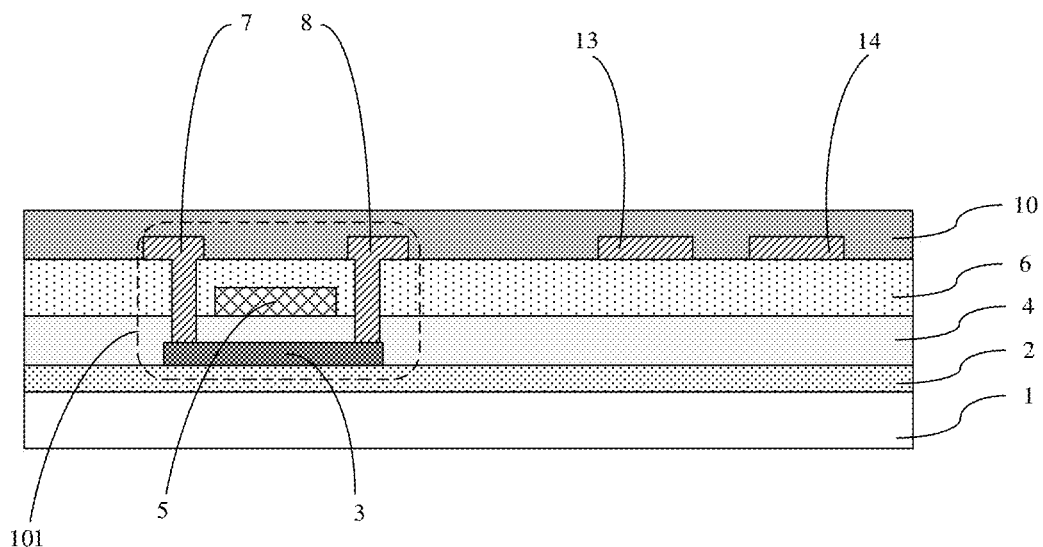

As shown in FIG. 2C, the non-oxidized portion of the metal layer 901 constitutes a first drain electrode 7, a first source electrode 8, a second drain electrode 13 and a second source electrode 14 of the second thin film transistor, thereby forming the first thin film transistor 101. The oxidized portion of the metal layer 901 (including the oxidized first portion 910 of the metal layer and the oxidized portion 921, away from the base substrate, of the second portion 92 of the metal layer) constitutes the dielectric layer 10, that is, the first drain electrode 7, the first source electrode 8, the second drain electrode 13, the second source electrode 14 and the dielectric layer 10 are formed by the same layer (the metal layer 901), thereby reducing the number of times of film formation and the number of times of patterning, and simplifying the manufacturing procedure of the array substrate.

Figure 2D:
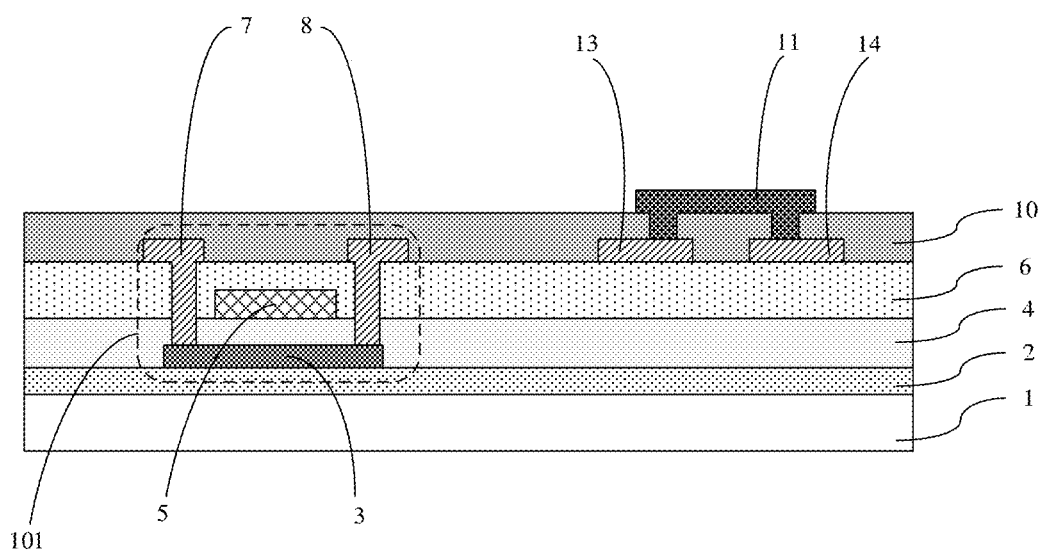

As shown in FIG. 2D, second via holes exposing the second drain electrode 13 and the second source electrode 14 are formed in the dielectric layer 10 by a patterning process, a second semiconductor layer 11 is formed on the dielectric layer 10, and the second semiconductor layer 11 in contact with the second drain electrode 13 and the second source electrode 14 through the second via holes. For example, the material of the second semiconductor layer 11 can be referred to the related description of the above embodiments.

Figure 2E:
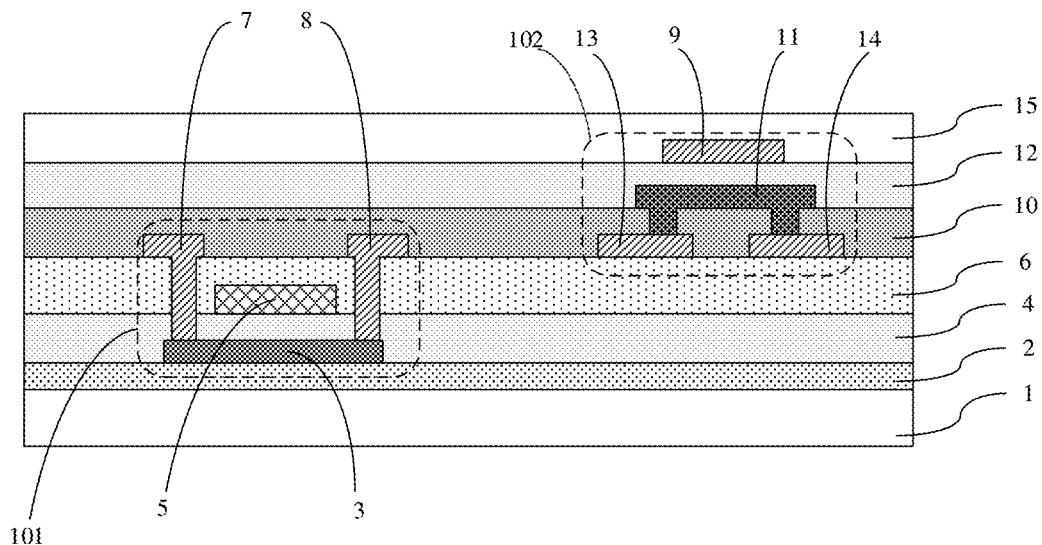

As shown in FIG. 2E, a second gate insulation layer 12 covering the second semiconductor layer 11 is formed. Then, a second gate electrode 9 is formed on the second gate insulation layer 12, thereby forming a second thin film transistor 102. Next, a passivation layer 15 covering the second thin film transistor 102 is formed. Specific methods and materials of forming the second gate insulation layer 12 and the passivation layer 15 can be referred to conventional techniques in the prior art.

Other features of the embodiment shown in FIGS. 2A-2E are the same as those in the above embodiments, the above description can be referred to and are not repeated here. The embodiment shown in FIGS. 2A-2E can achieve the same technical effects as or similar technical effects the embodiment shown in FIGS. 1A-1G.

FIGS. 3A-3F are schematic diagrams of still another manufacturing method of an array substrate provided by an embodiment of the present disclosure. This embodiment has the following differences from the embodiment shown in FIGS. 1A-1G.

Figure 3A:
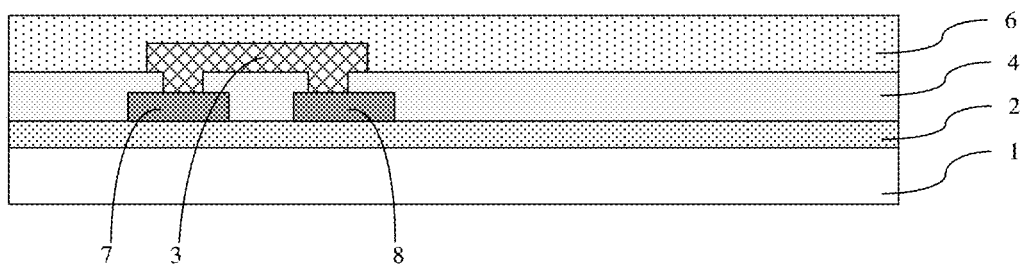
FIGS. 3A-3F are schematic diagrams of still another manufacturing method of an array substrate provided by an embodiment of the present disclosure.

As shown in FIG. 3A, the first drain electrode 7 and the first source electrode 8 of the first thin film transistor are formed on the buffer layer 2. Then, a first gate insulation layer 4 covering the first drain electrode 7 and the first source electrode 8 is formed, and first via holes exposing a part of the first drain electrode 7 and a part of the first source electrode 8 are formed in the first gate insulation layer 4 by a patterning process. The first semiconductor layer 3 is formed on the first gate insulation layer 4, and the first semiconductor layer 3 is in contact with the first drain electrode 7 and the first source electrode 8 through the first via holes.

Figure 3B:
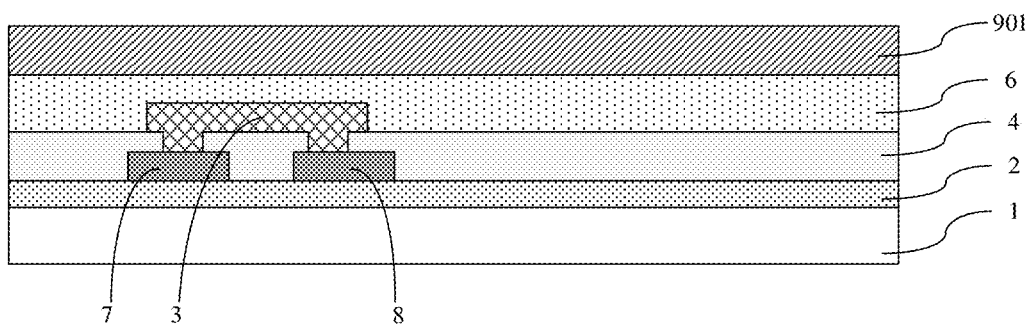

As shown in FIG. 3B, the manufacturing method of the array substrate further includes: forming a first insulation layer 6 and forming a metal layer 901 on the first insulation layer 6. The first insulation layer 6 covers the first semiconductor layer 3. The material and the manufacturing method of the first insulation layer 6, and the material and the manufacturing method of the metal layer 901 can be referred to the above description.

Figure 3C:
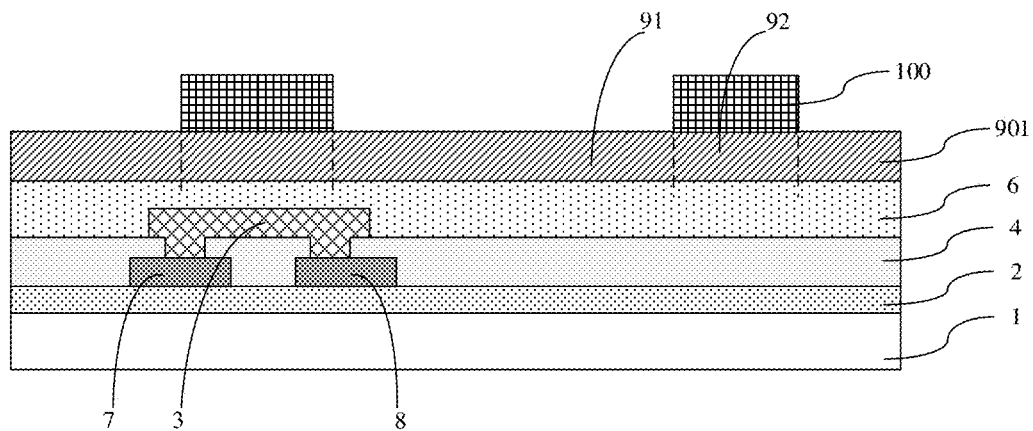

As shown in FIG. 3C, a sacrifice layer 100 is formed on the metal layer 901, and the metal layer 901 includes a first portion 91 not covered by the sacrifice layer 100 and a second portion 92 covered by the sacrifice layer 100. The pattern of the sacrifice layer 100 is different from that in the embodiment shown in FIG. 1D. The second portion 92 of the metal layer shown in FIG. 3C is used to subsequently form a first gate electrode, a second gate electrode, and a portion of the dielectric layer.

Figure 3D:
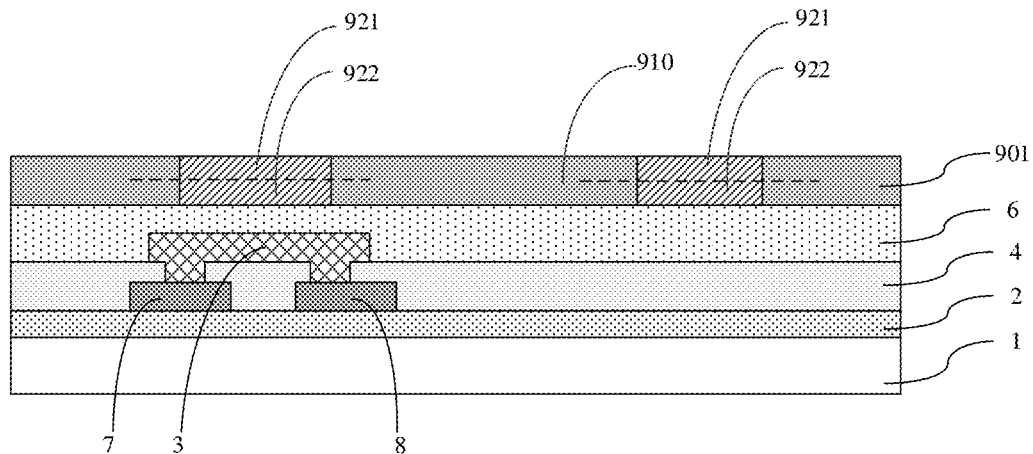

Then, a first oxidation treatment is performed on the first portion 91 of the metal layer to allow the entire first portion 91 of the metal layer to be completely oxidized, thereby obtaining the oxidized first portion 910 of the metal layer as shown in FIG. 3D. The second portion 92, covered by the sacrifice layer 100, of the metal layer is not oxidized because of protection by the sacrifice layer 100. The specific method of the first oxidation treatment is the same as that in the above embodiments.

After the first oxidation treatment is performed on the first portion 91 of the metal layer, the sacrifice layer 100 is removed to obtain a structure as shown in FIG. 2B, and for example, the sacrifice layer 100 is peeled off. Then, a second oxidation treatment is performed on the second portion 92 of the metal layer, and in a direction perpendicular to the metal layer 901, a portion 921, away from the base substrate, of the second portion 92 of the metal layer is oxidized, and a portion 922, close to the base substrate, of the second portion 92 of the metal layer is not oxidized. The method of the second oxidation treatment is the same as that in the above embodiments.

Figure 3E:
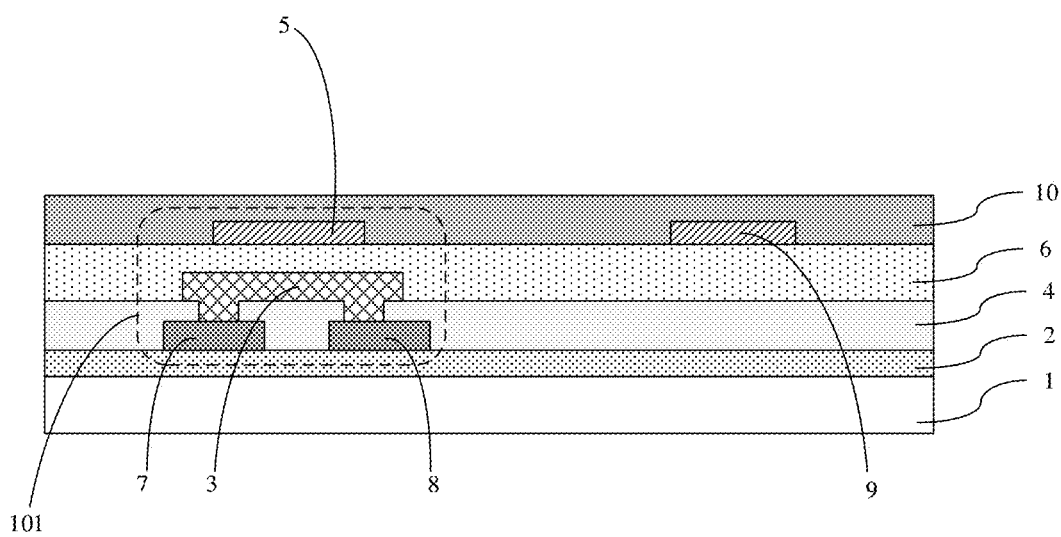

As shown in FIG. 3E, the non-oxidized portion of the metal layer 901 constitutes a first gate electrode 5 and a second gate electrode 9, thereby forming the first thin film transistor 101. The oxidized portion of the metal layer 901 (including the oxidized first portion 910 of the metal layer and the oxidized portion 921, away from the base substrate, of the second portion 92 of the metal layer) constitutes the dielectric layer 10, that is, the first gate electrode 5, the second gate electrode 9 and the dielectric layer 10 are formed by the same layer (the metal layer 901), thereby reducing the number of times of film formation and the number of times of patterning, and thereby simplifying the manufacturing procedure of the array substrate.

Figure 3F:
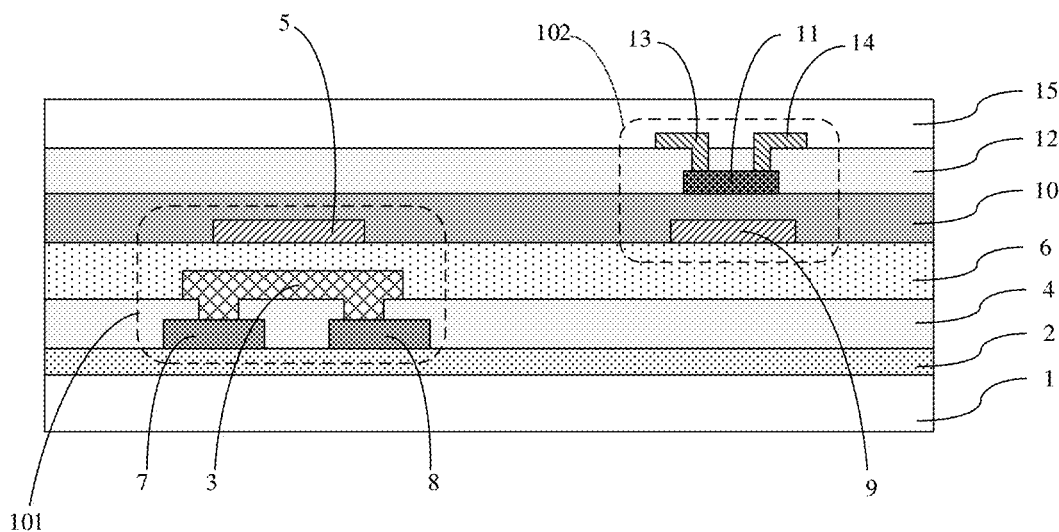

Next, as shown in FIG. 3F, a second semiconductor layer 11 and a second insulation layer 12 are formed on the dielectric layer 10, second via holes are formed in the second insulation layer 12 by a patterning process, and a second drain electrode 13 and a second source electrode 14 that are in contact with the second semiconductor layer 11 through the second via holes are formed on the second insulation layer 12, thereby forming a second thin film transistor 102. Then, a passivation layer 15 covering the second thin film transistor 102 is formed. The material of the second semiconductor layer 11 can be referred to the related description of the above embodiments.

In the embodiment shown in FIGS. 3A-3F, the dielectric layer 10 is further configured as a second gate insulation layer insulating the second semiconductor layer 11 from the second gate electrode 9, thereby omitting the step of respectively and individually manufacturing the second gate insulation layer and further simplifying the manufacturing process of the array substrate.

Other features of the embodiment shown in FIGS. 3A-3F are the same as those in the above embodiments, the above description can be referred to and are not repeated here. The embodiment shown in FIGS. 3A-3F can achieve the same or similar technical effects as the embodiment shown in FIGS. 1A-1G.

Figure 4A:
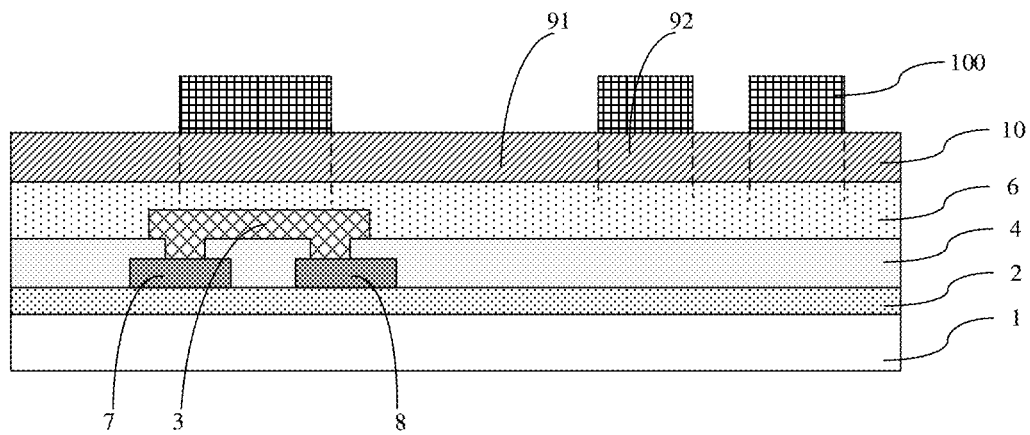
FIGS. 4A-4D are schematic diagrams of still another manufacturing method of an array substrate provided by an embodiment of the present disclosure.

FIGS. 4A-4D are schematic diagrams of still another manufacturing method of an array substrate provided by an embodiment of the present disclosure. In this embodiment, after performing the steps shown in FIGS. 3A-3B, as shown in FIG. 4A, a sacrifice layer 100 is formed on a metal layer 901, and the metal layer includes a first portion 91 not covered by the sacrifice layer 100 and a second portion 92 covered by the sacrifice layer 100. The pattern of the sacrifice layer 100 is different from that in the embodiment shown in FIG. 3C. The second portion 92 of the metal layer shown in FIG. 4A is used to subsequently form a first gate electrode, a second drain electrode, a second source electrode, and a portion of a dielectric layer.

Then, a first oxidation treatment is performed on the first portion 91 of the metal layer to allow the entire first portion 91 of the metal layer to be completely oxidized, thereby obtaining the oxidized first portion 910 of the metal layer as shown in FIG. 2B. The second portion 92, covered by the sacrifice layer 100, of the metal layer is not oxidized because of protection by the sacrifice layer 100. The specific method of the first oxidation treatment is the same as that in the above embodiments.

Figure 4B:
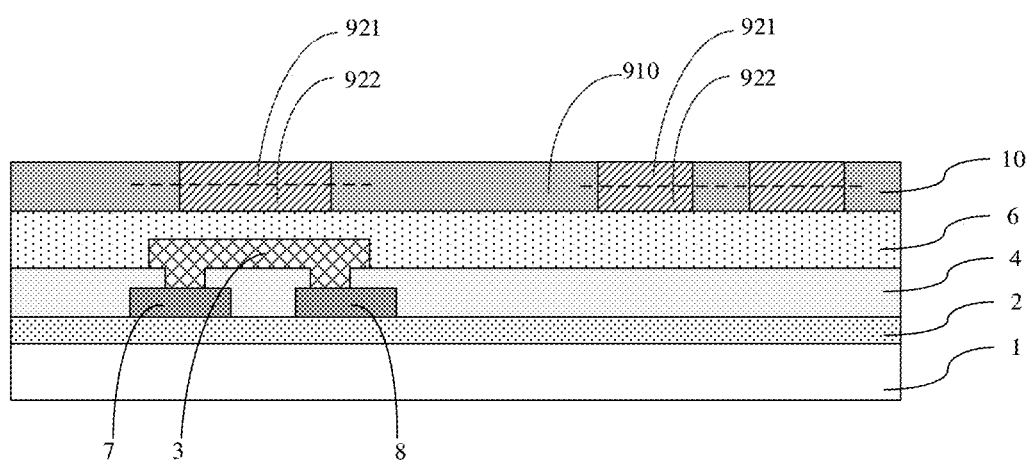

After the first oxidation treatment is performed on the first portion 91 of the metal layer, the sacrifice layer 100 is removed to obtain a structure as shown in FIG. 4B, and for example, the sacrifice layer 100 is peeled off. Then, a second oxidation treatment is performed on the second portion 92 of the metal layer, and in a direction perpendicular to the metal layer 901, a portion 921, away from the base substrate, of the second portion 92 of the metal layer is oxidized, and a portion 922, close to the base substrate, of the second portion 92 of the metal layer is not oxidized. The method of the second oxidation treatment is the same as that in the above embodiments.

Figure 4C:
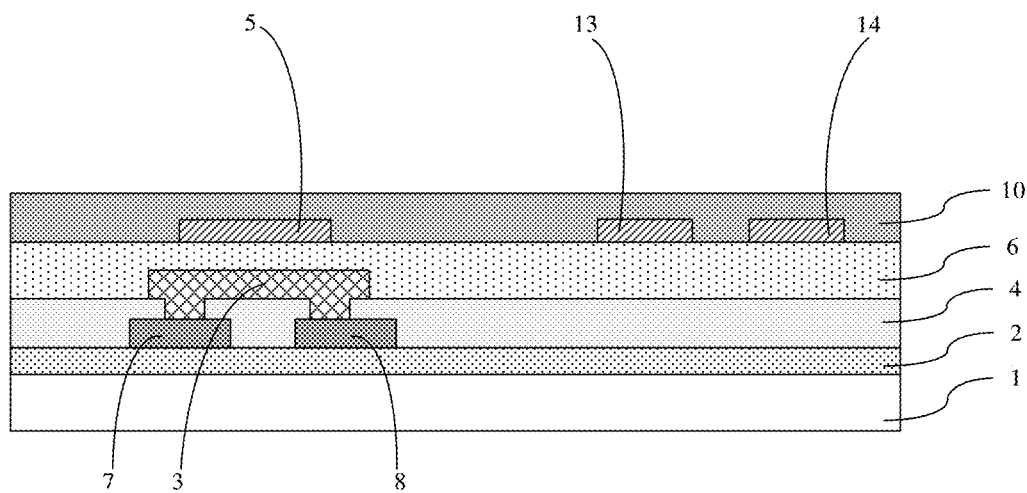

As shown in FIG. 4C, the non-oxidized portion of the metal layer 901 constitutes a first drain electrode 7, a first source electrode 8, a second drain electrode 13 and a second source electrode 14 of the second thin film transistor, thereby forming the first thin film transistor 101. The oxidized portion of the metal layer 901 (including the oxidized first portion 910 of the metal layer and the oxidized portion 921, away from the base substrate, of the second portion 92 of the metal layer) constitutes the dielectric layer 10, that is, the first gate electrode 5, the second drain electrode 13, the second source electrode 14 and the dielectric layer 10 are formed by the same layer, thereby reducing the number of times of film formation and the number of times of patterning, and thereby simplifying the manufacturing procedure of the array substrate.

Figure 4D:
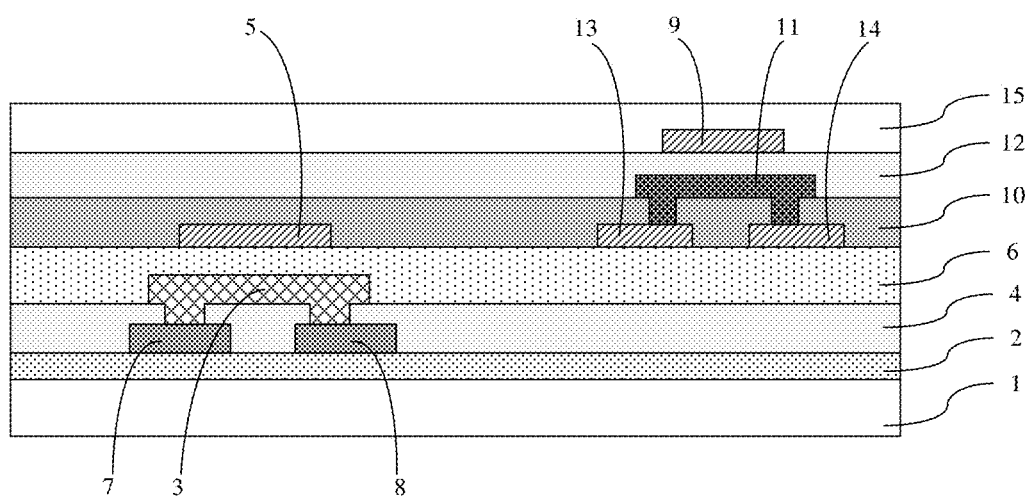

As shown in FIG. 4D, second via holes exposing the second drain electrode 13 and the second source electrode 14 are formed in the dielectric layer 10 by a patterning process, a second semiconductor layer 11 is formed on the dielectric layer 10, and the second semiconductor layer 11 in contact with the second drain electrode 13 and the second source electrode 14 through the second via holes. For example, the material of the second semiconductor layer 11 can be referred to the related description of the above embodiments. Then, a second gate insulation layer 12 covering the second semiconductor layer 11 is formed. And then, a second gate electrode 9 is formed on the second gate insulation layer 12, thereby forming a second thin film transistor 102. Next, a passivation layer 15 covering the second thin film transistor 102 is formed. Specific methods and materials of forming the second gate insulation layer 12 and the passivation layer 15 can be referred to conventional techniques in the prior art.

Other features of the embodiment shown in FIGS. 4A-4D are the same as those in the above embodiments, the above description can be referred to and are not repeated here. The embodiment shown in FIGS. 4A-4D can achieve the same technical effects as or similar technical effects to the embodiment shown in FIGS. 1A-1G.

Figure 5A:
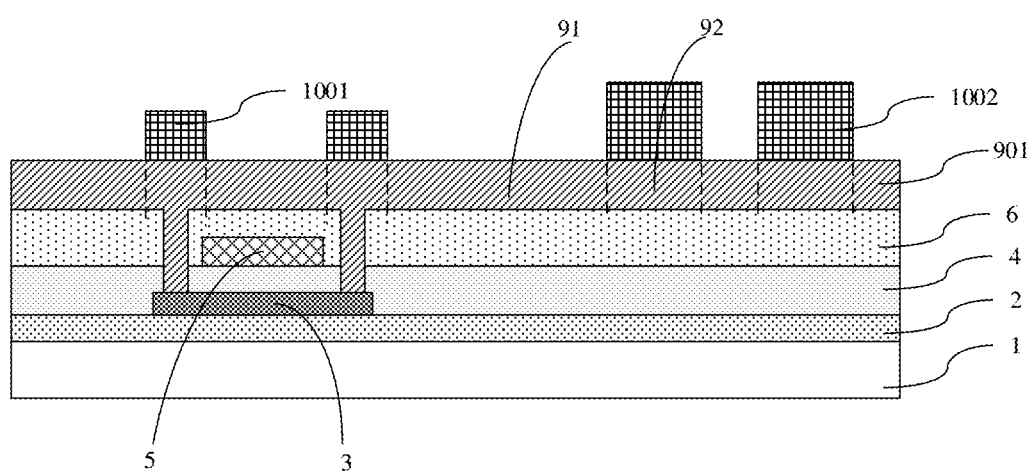
FIGS. 5A-5E are schematic diagrams of still another manufacturing method of an array substrate provided by an embodiment of the present disclosure.
Figure 5B:
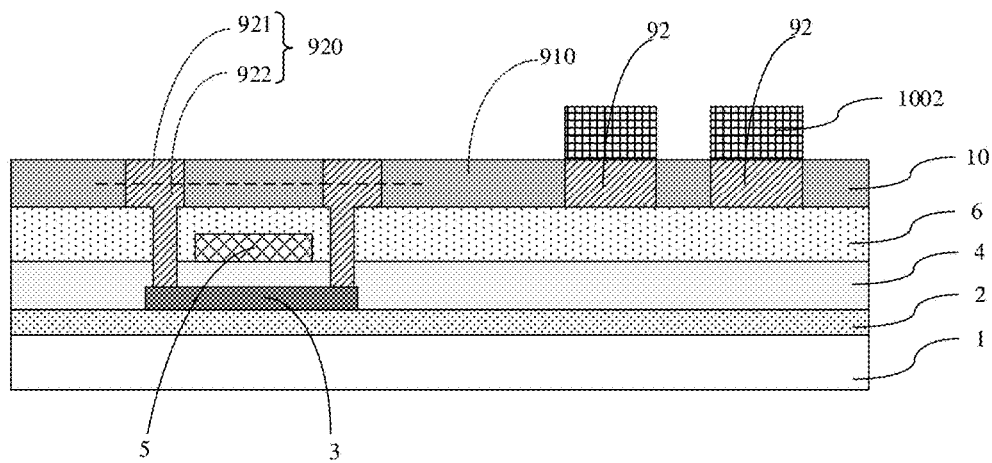

FIGS. 5A-5E are schematic diagrams of still another manufacturing method of an array substrate provided by an embodiment of the present disclosure. In this embodiment, after performing the steps shown in FIGS. 1A-1C, as shown in FIG. 5A, a sacrifice layer 100 is formed on a metal layer 901, and the metal layer 901 includes a first portion 91 not covered by the sacrifice layer 100 and a second portion 92 covered by the sacrifice layer 100. The sacrifice layer 100 includes a first portion 1001 and a second portion 1002, the first portion 1001 of the sacrifice layer covers a portion, for forming the first source electrode and the first drain electrode, of the second portion 92 of the metal layer, and the second portion 1002 of the sacrifice layer covers a portion, for forming the second source electrode and the second drain electrode, of the second portion 92 of the metal layer; the thickness of the first portion 1001 of the sacrifice layer in the direction perpendicular to the base substrate 1 is less than the thickness of the second portion 1002 of the sacrifice layer in the direction perpendicular to the base substrate 1. A first oxidation treatment is performed on the first portion 91 of the metal layer to allow the entire first portion 91 of the metal layer to be completely oxidized, thereby obtaining the oxidized first portion 910 of the metal layer as shown in FIG. 5B. The material of the metal layer and the specific method of the first oxidation treatment can be referred to the related description in the above embodiments.

As shown in FIG. 5B, the manufacturing method of the array substrate further includes: removing the first portion 1001 of the sacrifice layer and retaining at least a part of the second portion 1002 of the sacrifice layer after completing the first oxidation treatment. For example, the material of the sacrifice layer is a photoresist material. The first portion 1001 and the second portion 1002 of the sacrifice layer can be obtained by a photolithography process in cooperation with a half-tone mask. Then, by using an ashing process, the first portion 1001 of the sacrifice layer is removed while the second portion 1002 of the sacrifice layer is thinned, thereby retaining a part of the second portion 1002 of the sacrifice layer.

Figure 5C:
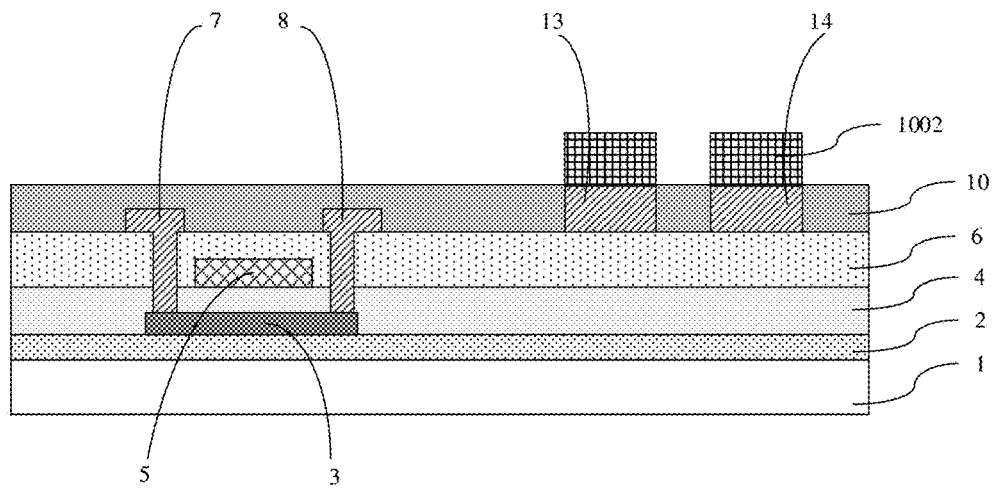

Next, as shown in FIGS. 5B and 5C, a second oxidation treatment is performed on the portion 920, for forming the first source electrode and the first drain electrode, of the second portion 92 of the metal layer. In a direction perpendicular to the metal layer, a part 921, away from the base substrate 1, of the portion 920, for forming the first source electrode and the first drain electrode, of the second portion 92 of the metal layer is oxidized, and a part 922, close to the base substrate 1, of the portion 920, for forming the first source electrode and the first drain electrode, of the second portion of the metal layer is not oxidized. Thus, as shown in FIG. 5C, the non-oxidized portion of the metal layer constitutes the first drain electrode 7 and the first source electrode 8, the portion of the metal layer covered by the second portion 1002 of the sacrifice layer constitutes the second drain electrode 13 and the second source electrode 14, and the oxidized portion of the metal layer (including the oxidized first portion 910 of the metal layer and the oxidized portion 921, away from the base substrate, of the second portion 92 of the metal layer) constitutes the dielectric layer 10. That is, the first drain electrode 7, the first source electrode 8, the second drain electrode 13, the second source electrode 14 and the dielectric layer 10 are formed by the same layer, thereby reducing the number of times of film formation and the number of times of patterning, and thereby simplifying the manufacturing procedure of the array substrate.

Figure 5D:
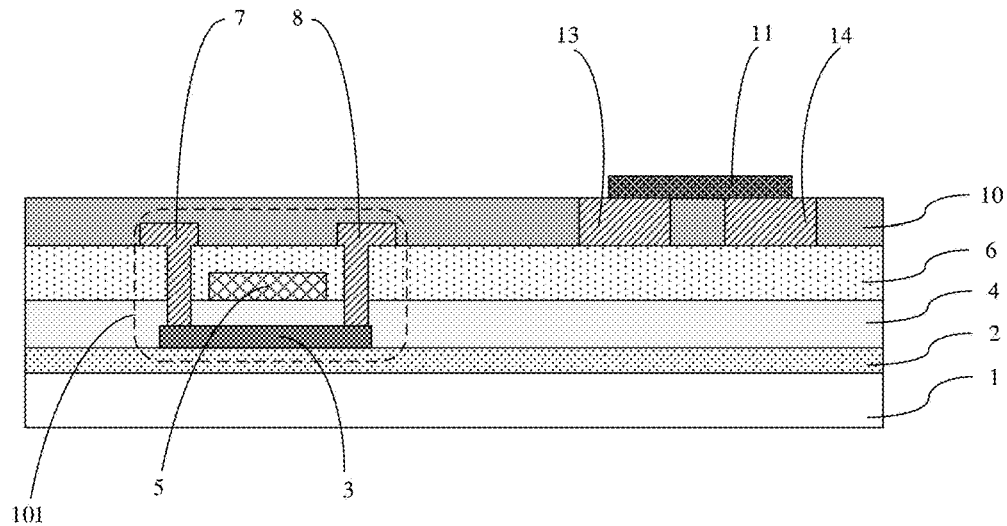

Then, as shown in FIG. 5D, the manufacturing method of the array substrate further includes: forming the second semiconductor layer 11 on the dielectric layer 10 after removing the second portion 1002 of the sacrifice layer. A surface, facing the dielectric layer 10, of the second semiconductor layer 11 is in direct contact with the second drain electrode 13 and the second source electrode 14. Compared with the case where the second drain electrode 13 and the second source electrode 14 are electrically connected to the second semiconductor layer 11 through the second via holes, in this case, the contact resistance between the second drain electrode 13 and the second semiconductor layer 11 and the contact resistance between the second source electrode 14 and the second semiconductor layer 11 are small, and the step of manufacturing the via holes is omitted.

It should be noted that the term "the surface, facing the dielectric layer 10, of the second semiconductor layer 11 is in direct contact with the second drain electrode 13 and the second source electrode 14" means that in the direction perpendicular to the base substrate 1, there is no other layer or structure between the surface, facing the dielectric layer 10, of the second semiconductor layer 11 and the second drain electrode 13 and between the surface, facing the dielectric layer 10, of the second semiconductor layer 11 and the second source electrode 14.

Figure 5E:
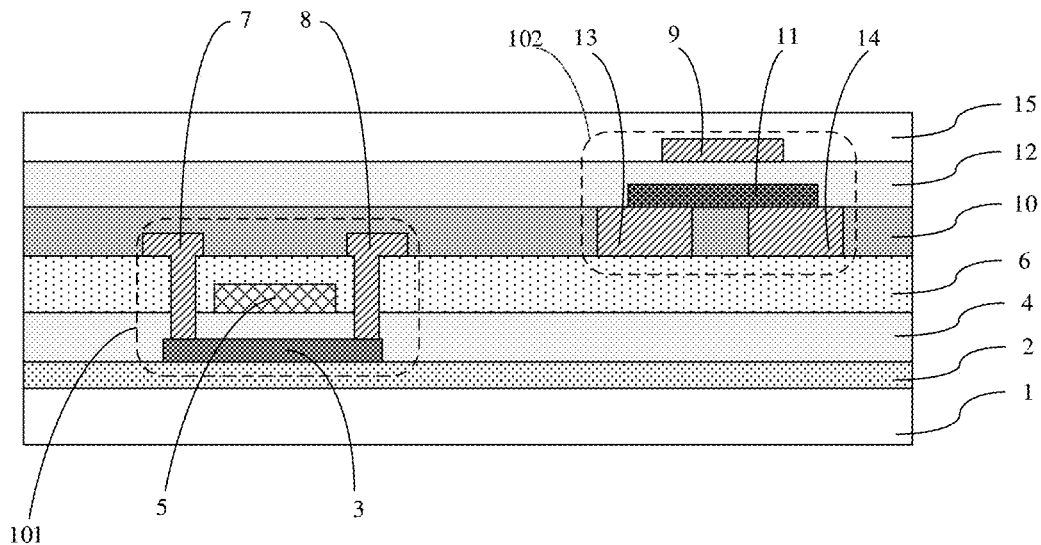

Then, as shown in FIG. 5E, the second gate insulation layer 12, the second gate 9, and the passivation layer 15 are sequentially formed by the steps described in the above embodiments, so as to obtain the array substrate.

Other features which are not mentioned in the embodiment shown in FIGS. 5A-5E are the same as those in the above embodiments, the above description can be referred to and will not be repeated here. The embodiment shown in FIGS. 5A-5E can achieve the same or similar technical effects as the embodiment shown in FIGS. 1A-1G.

Figure 6A:
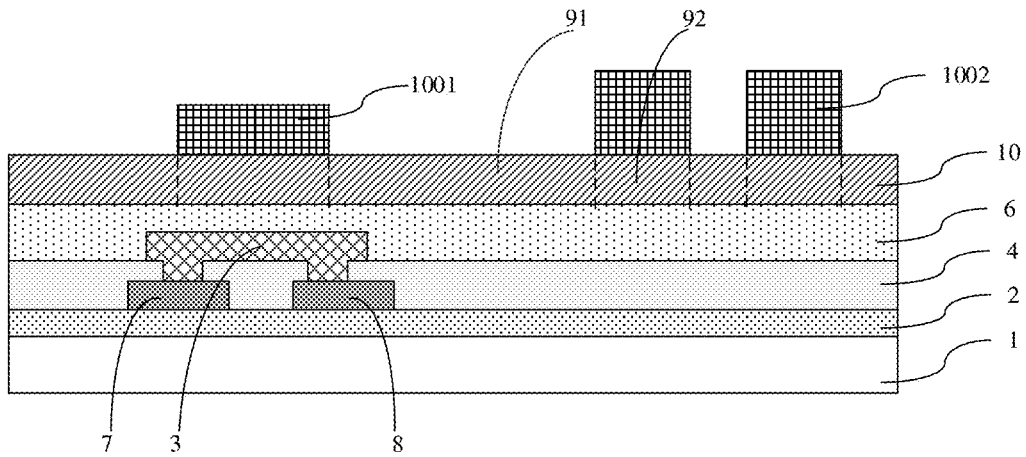
FIGS. 6A-6E are schematic diagrams of still another manufacturing method of an array substrate provided by an embodiment of the present disclosure.
Figure 6B:
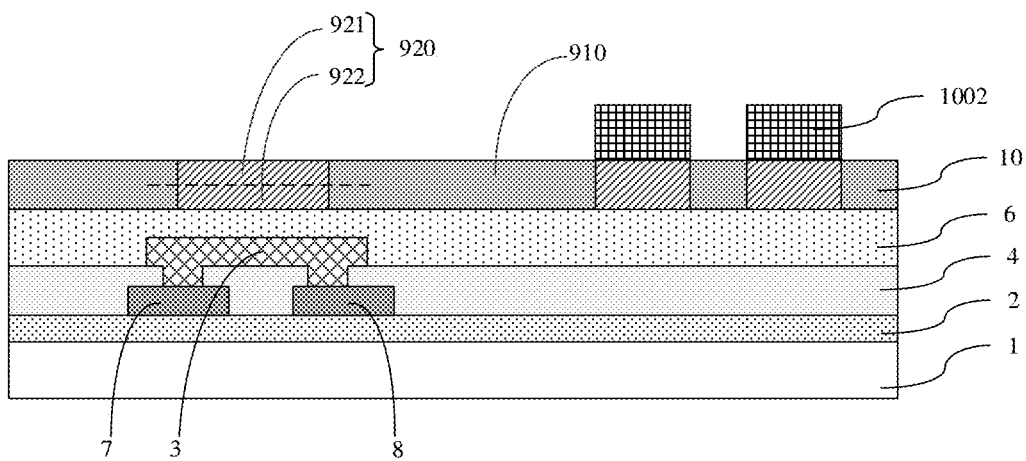

FIGS. 6A-6E are schematic diagrams of still another manufacturing method of an array substrate provided by an embodiment of the present disclosure. In this embodiment, after performing the steps shown in FIGS. 3A-3B, as shown in FIG. 6A, a sacrifice layer 100 is formed on a metal layer 901, and the metal layer 901 includes a first portion 91 not covered by the sacrifice layer 100 and a second portion 92 covered by the sacrifice layer 100. The sacrifice layer 100 includes a first portion 1001 and a second portion 1002, the first portion 1001 of the sacrifice layer covers a portion, for forming the first gate electrode, of the second portion 92 of the metal layer, and the second portion 1002 of the sacrifice layer covers a portion, for forming the second source electrode and the second drain electrode, of the second portion 92 of the metal layer; the thickness of the first portion 1001 of the sacrifice layer in the direction perpendicular to the base substrate 1 is less than the thickness of the second portion 1002 of the sacrifice layer in the direction perpendicular to the base substrate 1. A first oxidation treatment is performed on the first portion 91 of the metal layer to allow the entire first portion 91 of the metal layer to be completely oxidized, thereby obtaining the oxidized first portion 910 of the metal layer as shown in FIG. 6B. The material of the metal layer and the specific method of the first oxidation treatment can be referred to the related description in the above embodiments.

As shown in FIG. 6B, the manufacturing method of the array substrate further includes: removing the first portion 1001 of the sacrifice layer and retaining at least a part of the second portion 1002 of the sacrifice layer after completing the first oxidation treatment. The specific implementation method is as described above.

Figure 6C:
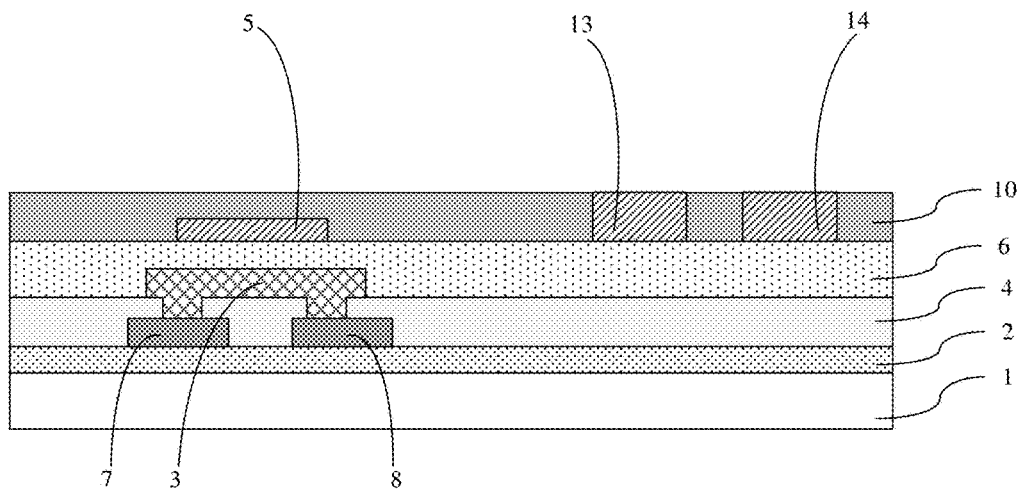

Next, as shown in FIGS. 6B and 6C, a second oxidation treatment is performed on the portion 920, for forming the first gate electrode, of the second portion 92 of the metal layer. In a direction perpendicular to the metal layer, a part 921, away from the base substrate 1, of the portion 920, for forming the first gate electrode, of the second portion 92 of the metal layer is oxidized, and a part 922, close to the base substrate 1, of the portion 920, for forming the first gate electrode, of the second portion of the metal layer is not oxidized. Thus, as shown in FIG. 6C, the non-oxidized portion of the metal layer constitutes the first gate electrode 5, the portion, covered by the second portion 1002 of the sacrifice layer during the second oxidation treatment, of the metal layer constitutes the second drain electrode 13 and the second source electrode 14, and the oxidized portion of the metal layer (including the oxidized first portion 910 of the metal layer and the oxidized portion 921, away from the base substrate, of the second portion 92 of the metal layer) constitutes the dielectric layer 10. That is, the first gate electrode 5, the second drain electrode 13, the second source electrode 14 and the dielectric layer 10 are formed by the same layer, thereby reducing the number of times of film formation and the number of times of patterning, and thereby simplifying the manufacturing procedure of the array substrate.

Figure 6D:
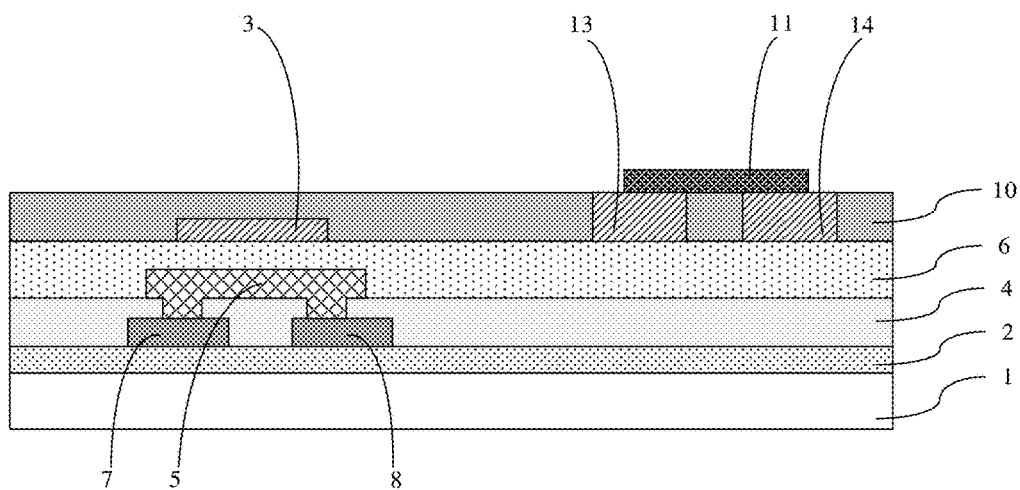

Then, as shown in FIG. 6D, the manufacturing method of the array substrate further includes: forming a second semiconductor layer 11 on the dielectric layer 10 after removing the second portion 1002 of the sacrifice layer. A surface, facing the dielectric layer 10, of the second semiconductor layer 11 is in direct contact with the second drain electrode 13 and the second source electrode 14. Compared with the case where the second drain electrode 13 and the second source electrode 14 are electrically connected to the second semiconductor layer 11 through the second via holes, in this case, the contact resistance between the second drain electrode 13 and the second semiconductor layer 11 and the contact resistance between the second source electrode 14 and the second semiconductor layer 11 are small, and the step of manufacturing the via holes is omitted.

Figure 6E:
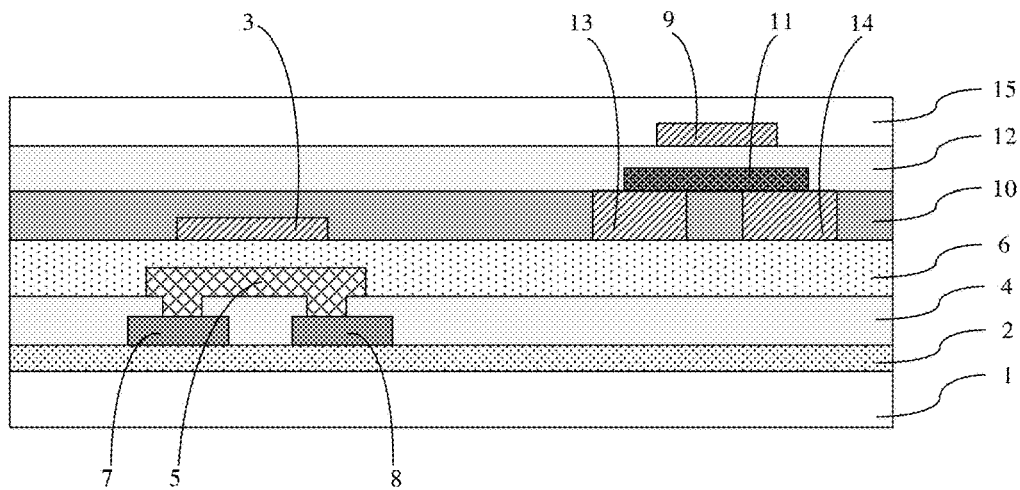

Then, as shown in FIG. 6E, the second gate insulation layer 12, the second gate 9, and the passivation layer 15 are sequentially formed by using the steps described in the above embodiments, so as to obtain the array substrate.

Other features which are not mentioned in the embodiment shown in FIGS. 6A-6E are the same as those in the above embodiments, the above description can be referred to and are not repeated here. The embodiment shown in FIGS. 6A-6E can achieve the same technical effects as or similar technical effects to the embodiment shown in FIGS. 1A-1G.

Figure 7A:
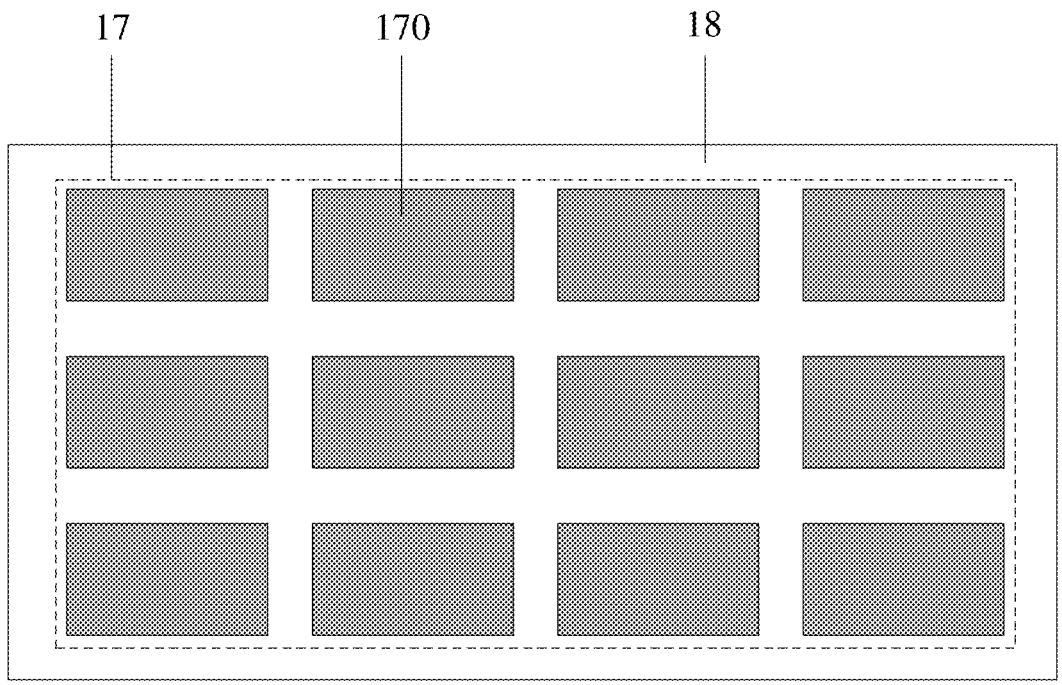
FIG. 7A is a schematic plan view of an array substrate provided by an embodiment of the present disclosure.

FIG. 7A is a schematic plan view of an array substrate provided by an embodiment of the present disclosure. As shown in FIG. 7A, the array substrate includes an operation region 17 and a peripheral region 18. The operation region 17 includes a plurality of operation units 170 arranged in an array, and each of the plurality of operation units 170 includes an operation driving circuit; and the peripheral region 18 is located at the periphery of the operation region 17. The peripheral region 18 is provided with a peripheral driving circuit, and the peripheral driving circuit is configured to drive the operation driving circuit. For example, the operation driving circuit is a pixel driving circuit. In one embodiment, for example, the peripheral circuit includes the first thin film transistor, and the operation driving circuit includes the second thin film transistor, and the second thin film transistor is configured to control the operation of each of the plurality of operation units 170. For example, the peripheral driving circuit is a gate driving circuit, such as a GOA driving circuit.

Figure 7B:
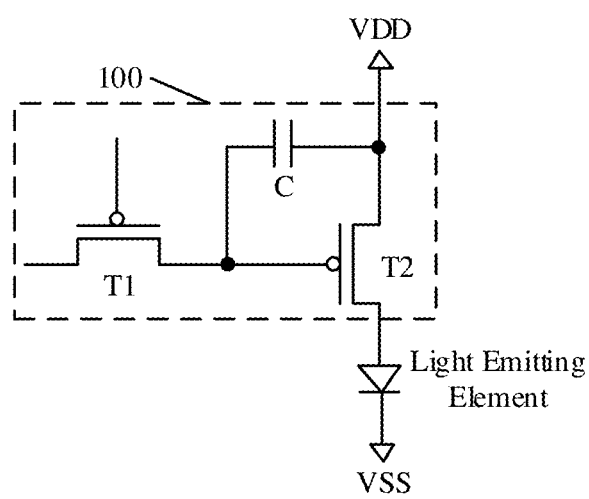
FIG. 7B is a schematic diagram of a pixel driving circuit.

For example, in one embodiment, the operation driving circuit includes the first thin film transistor and the second thin film transistor, and one of the first drain electrode and the first source electrode is electrically connected to the second gate electrode. For example, the operation driving circuit is a pixel driving circuit. FIG. 7B is a schematic diagram of a pixel driving circuit, the case that the pixel driving circuit is a 2T1C circuit is taken as an example, and the light emitting element in FIG. 7B is, for example, an organic light emitting diode. The 2T1C circuit shown in FIG. 7B includes the first thin film transistor T1 and the second thin film transistor T2, that is, in the 2T1C circuit, the first thin film transistor is a switch transistor T1 and the second thin film transistor is a driving transistor T2. For example, the second semiconductor layer of the second thin film transistor is an oxide semiconductor layer, so that the leakage current of the second thin film transistor is small, and by using the second thin film transistor as the driving transistor T2, the leakage current can be reduced to achieve a better display effect. One selected from a group consisting of the first drain electrode and the first source electrode is electrically connected to the second gate electrode. For example, one selected from a group consisting of the first drain electrode and the first source electrode of the first thin film transistor T1 is connected to the second gate electrode of the second thin film transistor T2, and for example, the one selected from a group consisting of the first drain electrode and the first source electrode of the first thin film transistor T1 is integral with the second gate electrode. It should be noted that the term "the one selected from a group consisting of the first drain electrode and the first source electrode of the first thin film transistor T1 is integral with the second gate electrode" means that the one selected from a group consisting of the first drain electrode and the first source electrode of the first thin film transistor T1 is made of the same material as the second gate electrode, and there is no gap therebetween.

For example, as shown in FIG. 7B, the operation driving circuit further includes a storage capacitor C, and the storage capacitor C includes a first plate and a second plate that are opposite to each other. For example, the first plate is electrically connected to the second drain electrode. For example, in the manufacturing method of the array substrate provided by at least one embodiment of the present disclosure, a same layer is processed to form the first plate, the second source electrode and the second drain electrode by the same layer, which can be realized in the manufacturing method of the array substrate provided by all the above embodiments. The following description takes one embodiment as an example, and the features in different embodiments of the present disclosure can be combined to obtain a new embodiment.

Figure 8A:
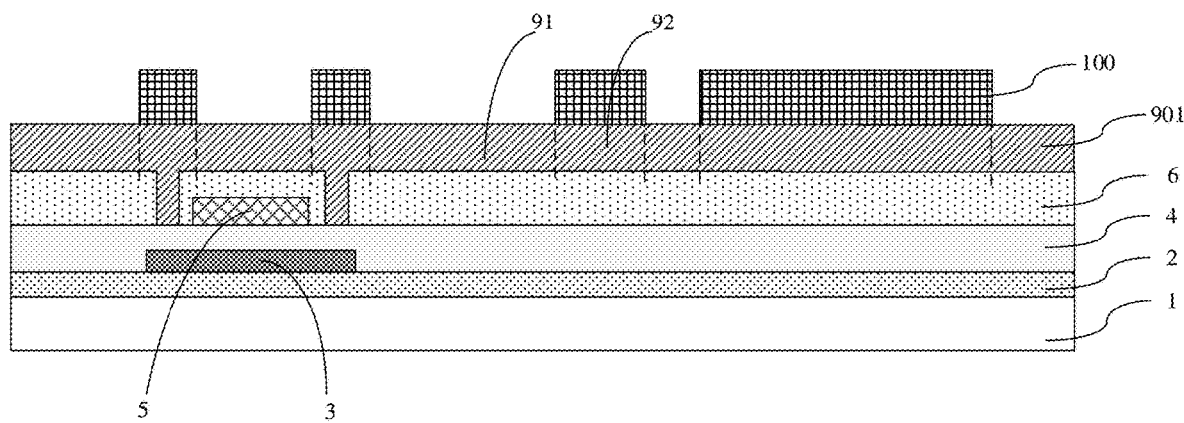
FIGS. 8A-8C are schematic diagrams of still another manufacturing method of an array substrate provided by an embodiment of the present disclosure.
Figure 8B:
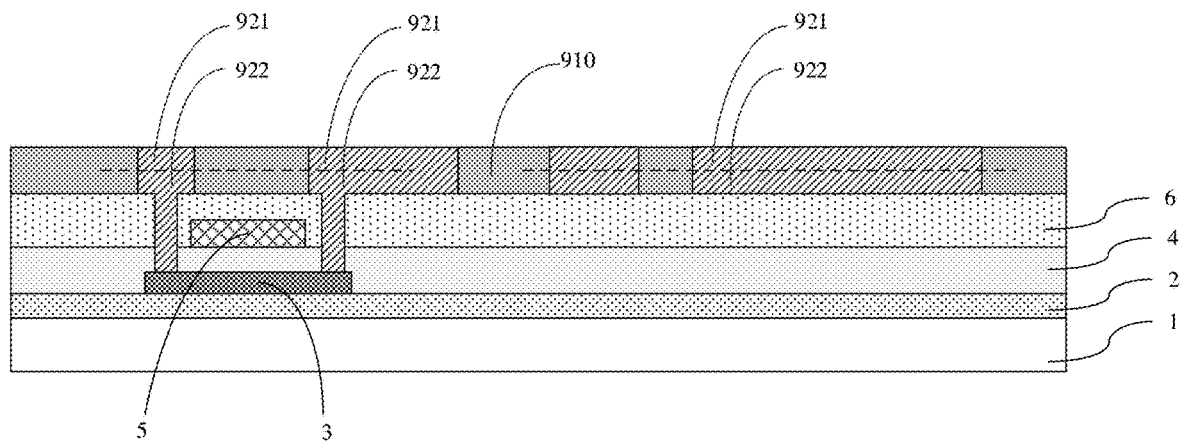
Figure 8C:
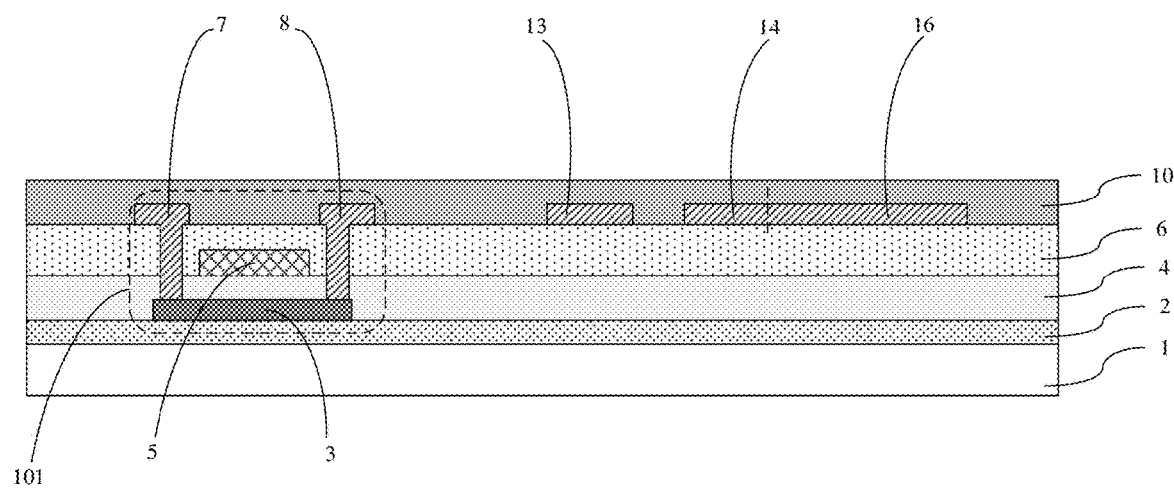

FIGS. 8A-8C are schematic diagrams of still another manufacturing method of an array substrate provided by an embodiment of the present disclosure. After performing the steps shown in FIGS. 1A-1C, as shown in FIG. 8A, a sacrifice layer 100 is formed on the metal layer 901, and the metal layer includes a first portion 91 not covered by the sacrifice layer 100 and a second portion 92 covered by the sacrifice layer 100. The pattern of the sacrifice layer 100 is different from that in the embodiment shown in FIG. 1D. The second portion 92 of the metal layer shown in FIG. 2A is used to subsequently form a first drain electrode, a first source electrode, a second drain electrode, a second source electrode, a first plate and a portion of a dielectric layer.

Then, a first oxidation treatment is performed on the first portion 91 of the metal layer to allow the entire first portion 91 of the metal layer to be completely oxidized, thereby obtaining the oxidized first portion 910 of the metal layer as shown in FIG. 8B. The second portion 92, covered by the sacrifice layer 100, of the metal layer is not oxidized because of protection by the sacrifice layer 100. The material of the metal layer and the specific method of the first oxidation treatment are the same as those in the above embodiments.

As shown in FIG. 8C, the non-oxidized portion of the metal layer 901 constitutes the first drain electrode 7, the first source electrode 8, the second drain electrode 13 and the second source electrode 14 of the second thin film transistor, and the first plate 16, so that the second source electrode 14 and the first plate 16 are integral. Therefore, the first thin film transistor 101 is formed. The oxidized portion of the metal layer 901 (including the oxidized first portion 910 of the metal layer and the oxidized portion 921, away from the base substrate, of the second portion 92 of the metal layer) constitutes the dielectric layer 10, that is, the first drain electrode 7, the first source electrode 8, the second drain electrode 13, the second source electrode 14 and the dielectric layer 10 are formed by the same layer (the metal layer 901), thereby reducing the number of times of film formation and the number of times of patterning, and thereby simplifying the manufacturing procedure of the array substrate. In this embodiment, the procedure after FIG. 8C can be referred to the relate description of the above embodiments, and for example, the steps of FIGS. 2D-2E can be performed.

An embodiment of the present disclosure further provides an array substrate, and the array substrate includes a first thin film transistor, a second thin film transistor and a dielectric layer. The first thin film transistor includes a first semiconductor layer, a first gate electrode, a first drain electrode and a first source electrode; the second thin film transistor includes a second semiconductor layer, a second gate electrode, a second drain electrode and a second source electrode; the dielectric layer spaces the first semiconductor layer apart from the second semiconductor layer and covers at least one selected from the group consisting of the first gate electrode, the first drain electrode and the first source electrode, and at least one selected from the group consisting of the second gate electrode, the second drain electrode and the second source electrode in a direction perpendicular to the dielectric layer; the at least one selected from the group consisting of the first gate electrode, the first drain electrode and the first source electrode, and the at least one selected from the group consisting of the second gate electrode, the second drain electrode and the second source electrode are in a same layer, both of a material of the at least one selected from the group consisting of the first gate electrode, the first drain electrode and the first source electrode and a material of the at least one selected from the group consisting of the second gate electrode, the second drain electrode and the second source electrode are a first material, and a material of the dielectric layer is an oxide of the first material.

As shown in FIG. 1G, the array substrate provided by an embodiment of the present disclosure includes: a first thin film transistor 101, a second thin film transistor 102 and a dielectric layer 10. The first thin film transistor 101 includes a first semiconductor layer 3, a first gate electrode 5, a first drain electrode 7, and a first source electrode 8; the second thin film transistor 102 includes a second semiconductor layer 11, a second gate electrode 9, a second drain electrode 13, and a second source electrode 14; the dielectric layer 10 spaces the first semiconductor layer 3 apart from the second semiconductor layer 11 and covers the first drain electrode 7, the first source electrode 8 and the second gate electrode 9 in the direction perpendicular to the dielectric layer 10; all of a material of the first drain electrode 7, a material of the first source electrode 8 and a material of the second gate electrode 9 are the first materials, all of the first drain electrode 7, the first source electrode 8 and the second gate electrode 9 are arranged in a same layer, and a material of the dielectric layer 10 is an oxide of the first material.

For example, the elemental metal is aluminum, and the oxide of the elemental metal is aluminum oxide ($Al_2O_3$). Of course, the elemental metal is not limited to aluminum, and can be, for example, zinc, tin, tantalum, titanium, etc., and the material of the dielectric layer 10 is an oxide corresponding to these metals.

For example, in the array substrate shown in FIG. 1G, the dielectric layer 10 is also configured as a gate insulation layer insulating the second gate electrode 9 from the second semiconductor layer 11, so as to simplify the structure of the array substrate.

For example, the array substrate further includes a first insulation layer 6. The first insulation layer 6 is located between the first semiconductor layer 3 and the dielectric layer 10, and the dielectric layer 10 is in direct contact with the first insulation layer 6, so that at least one of the second drain electrode 13 and the second source electrode 14 is insulated from a part of the structure of the first thin film transistor 101, and at the same time, the effect of isolating the first semiconductor layer 3 from the second semiconductor layer 11 is enhanced. At the same time, for example, the first insulation layer 6 insulates the first gate electrode 5 from the first drain electrode 7 and the first source electrode 8, so as to simplify the structure of the array substrate. For example, a material of the first insulation layer 6 is silicon nitride or silicon oxide (e.g., silicon dioxide). Silicon nitride and silicon oxide can better block the migration of hydrogen ions and oxygen ions, so as to better prevent hydrogen and oxygen in the first semiconductor layer 3 from entering the second semiconductor layer 11, and at the same time, to prevent hydrogen and oxygen in the second semiconductor layer 11 from entering the first semiconductor layer 3 during the heat treatment process of the second semiconductor layer 11.

Other structural features and technical effects of the array substrate shown in FIG. 1G can be referred to the related description of the embodiment shown in FIGS. 1A-1G.

In the array substrate shown in FIG. 2E, the dielectric layer 10 covers the first drain electrode 7, the first source electrode 8, the second drain electrode 13 and the second source electrode 14 in the direction perpendicular to the dielectric layer 10. All of a material of the first drain electrode 7, a material of the first source electrode 8, a material of the second drain electrode 13 and a material of the second source electrode 14 are the first material, all of the first drain electrode 7, the first source electrode 8, the second drain electrode 13 and the second source electrode 14 are disposed in a same layer, and the material of the dielectric layer 10 is the oxide of the first material. Other features of the array substrate can be referred to the related description of the above embodiments.

In the array substrate shown in FIG. 3F, the dielectric layer 10 covers the first gate electrode 5 and the second gate electrode 9 in the direction perpendicular to the dielectric layer 10; both a material of the first gate electrode 5 and a material of the second gate electrode 9 are first material, both the first gate electrode 5 and the second gate electrode 9 are disposed in a same layer, and the material of the dielectric layer 10 is the oxide of the first material. Other features of the array substrate can be referred to the related description of the above embodiments.

In the array substrate shown in FIG. 4D, the dielectric layer 10 covers the first gate electrode 5, the second drain electrode 13 and the second source electrode 14 in the direction perpendicular to the dielectric layer 10. The first gate electrode 5, the second drain electrode 13 and the second source electrode 14 are a formed of a first material and disposed on a same layer, and the material of the dielectric layer 10 is the oxide of the first material. Other features of the array substrate can be referred to the related description of the above embodiments.

For example, in the array substrate shown in FIG. 6E, a surface, facing the dielectric layer 10, of the second semiconductor layer 11 is in direct contact with the second drain electrode 13 and the second source electrode 14. Compared with the case where the second drain electrode 13 and the second source electrode 14 are electrically connected to the second semiconductor layer 11 through the second via holes, in this case, the contact resistance between the second drain electrode 13 and the second semiconductor layer 11 and the contact resistance between the second source electrode 14 and the second semiconductor layer 11 are small, and the step of manufacturing the via holes is omitted. Other features of the array substrate can be referred to the related description of the above embodiments.

For example, in combination with FIGS. 7A and 8C, in the array substrate provided by an embodiment of the present disclosure, the dielectric layer 10 covers the first drain electrode 7, the first source electrode 8, the second drain electrode 13, the second source electrode 14 and the first plate 16 in the direction perpendicular to the dielectric layer 10; all of a material of the first drain electrode 7, a material of the first source electrode 8, a material of the second drain electrode 13, a material of the second source electrode 14 and a material of the first plate 16 are the first material, all of the first drain electrode 7, the first source electrode 8, the second drain electrode 13, the second source electrode 14 and the first plate 16 are disposed in a same layer, and the material of the dielectric layer 10 is the oxide of the first material. Other features of the array substrate can be referred to the related description of the above embodiments.

What have been described above are only specific implementations of the present disclosure, the protection scope of the present disclosure is not limited thereto. Therefore, the protection scope of the present disclosure should be based on the protection scope of the claims.

What is claimed is:

1. A manufacturing method of an array substrate, comprising:
   forming a first thin film transistor, wherein the first thin film transistor comprises a first semiconductor layer, a first gate electrode, a first drain electrode, and a first source electrode;
   forming a second thin film transistor, wherein the second thin film transistor comprises a second semiconductor layer, a second gate electrode, a second drain electrode, and a second source electrode; and
   forming a dielectric layer, wherein the dielectric layer spaces the first semiconductor layer apart from the second semiconductor layer,
   the method further comprises: processing a same layer to form at least one selected from a group consisting of the first gate electrode, the first drain electrode, and the first source electrode, at least one selected from a group consisting of the second gate electrode, the second drain electrode, and the second source electrode, and the dielectric layer by the same layer.

2. The manufacturing method of the array substrate according to claim 1, wherein the processing the same layer comprises:
providing a base substrate;
forming a metal layer on the base substrate;
forming a sacrifice layer on the metal layer, the metal layer comprising a first portion not covered by the sacrifice layer and a second portion covered by the sacrifice layer;
performing a first oxidation treatment on the first portion of the metal layer to allow the entire first portion of the metal layer to be completely oxidized;
removing the sacrifice layer; and
performing a second oxidation treatment on the second portion of the metal layer, wherein in a direction perpendicular to the metal layer, a portion, away from the base substrate, of the second portion of the metal layer is oxidized, and a portion, close to the base substrate, of the second portion of the metal layer is not oxidized,
a non-oxidized portion of the metal layer constitutes the first source electrode, the first drain electrode, the second source electrode, and the second drain electrode, and an oxidized portion of the metal layer constitutes the dielectric layer.

3. The manufacturing method of the array substrate according to claim 1, wherein a material of the first semiconductor layer is poly-silicon, and a material of the second semiconductor layer is a metal oxide.

4. The manufacturing method of the array substrate according to claim 1, wherein the processing the same layer comprises:
providing a base substrate;
forming a metal layer on the base substrate;
forming a sacrifice layer on the metal layer, the metal layer comprising a first portion not covered by the sacrifice layer and a second portion covered by the sacrifice layer;
performing a first oxidation treatment on the first portion of the metal layer to allow the entire first portion of the metal layer to be completely oxidized;
removing the sacrifice layer; and
performing a second oxidation treatment on the second portion of the metal layer, wherein in a direction perpendicular to the metal layer, a portion, away from the base substrate, of the second portion of the metal layer is oxidized, and a portion, close to the base substrate, of the second portion of the metal layer is not oxidized,
wherein the non-oxidized portion of the metal layer constitutes the first gate electrode, the second source electrode, and the second drain electrode, and the oxidized portion of the metal layer constitutes the dielectric layer.

5. The manufacturing method of the array substrate according to claim 1, wherein the processing the same layer comprises:
providing a base substrate;
forming a metal layer on the base substrate;
forming a sacrifice layer on the metal layer, the metal layer comprising a first portion not covered by the sacrifice layer and a second portion covered by the sacrifice layer; and performing a first oxidation treatment on the first portion of the metal layer to allow the entire first portion of the metal layer to be completely oxidized,
wherein the sacrifice layer comprises a first portion and a second portion, the first portion of the sacrifice layer covers a portion, for forming the first source electrode and the first drain electrode, of the second portion of the metal layer, the second portion of the sacrifice layer covers a portion, for forming the second source electrode and the second drain electrode, of the second portion of the metal layer, and a thickness of the first portion of the sacrifice layer in a direction perpendicular to the base substrate is less than a thickness of the second portion of the sacrifice layer in the direction perpendicular to the base substrate,
the manufacturing method of the array substrate further comprises:
removing the first portion of the sacrifice layer and retaining at least a part of the second portion of the sacrifice layer after completing the first oxidation treatment; and
performing a second oxidation treatment on the portion, for forming the first source electrode and the first drain electrode, of the second portion of the metal layer, wherein in a direction perpendicular to the metal layer, a part, away from the base substrate, of the portion, for forming the first source electrode and the first drain electrode, of the second portion of the metal layer is oxidized, and a part, close to the base substrate, of the portion, for forming the first source electrode and the first drain electrode, of the second portion of the metal layer is not oxidized, and wherein
in a region corresponding to the first portion of the sacrifice layer, the non-oxidized portion of the metal layer constitutes the first gate electrode, the portion, covered by the second portion of the sacrifice layer during the second oxidation treatment, of the metal layer constitutes the second drain electrode and the second source electrode, and the oxidized portion of the metal layer constitutes the dielectric layer.

6. The manufacturing method of the array substrate according to claim 1, wherein the array substrate comprises:
an operation region, comprising a plurality of operation units arranged in an array, wherein each of the plurality of operation units comprises an operation driving circuit; and
a peripheral region at a periphery of the operation region, wherein the peripheral region is provided with a peripheral driving circuit, and the peripheral driving circuit is configured to drive the operation driving circuit,
wherein the operation driving circuit comprises the first thin film transistor and the second thin film transistor, and one selected from a group consisting of the first drain electrode and the first source electrode is electrically connected to the second gate electrode.

7. The manufacturing method of the array substrate according to claim 1, wherein the processing the same layer comprises:
providing a base substrate;
forming a metal layer on the base substrate;
forming a sacrifice layer on the metal layer, the metal layer comprising a first portion not covered by the sacrifice layer and a second portion covered by the sacrifice layer;
performing a first oxidation treatment on the first portion of the metal layer to allow the entire first portion of the metal layer to be completely oxidized, wherein the sacrifice layer comprises a first portion and a second portion, the first portion of the sacrifice layer covers a portion, for forming the first source electrode and the first drain electrode, of the second portion of the metal layer, the second portion of the sacrifice layer covers a portion, for forming the second source electrode and the second drain electrode, of the second portion of the metal layer, and a thickness of the first portion of the sacrifice layer in a direction perpendicular to the base substrate is less than a thickness of the second portion of the sacrifice layer in the direction perpendicular to the base substrate, the manufacturing method of the array substrate further comprises:

removing the first portion of the sacrifice layer and retaining at least a part of the second portion of the sacrifice layer after completing the first oxidation treatment; and performing a second oxidation treatment on the portion, for forming the first source electrode and the first drain electrode, of the second portion of the metal layer, wherein in a direction perpendicular to the metal layer, a part, away from the base substrate, of the portion, for forming the first source electrode and the first drain electrode, of the second portion of the metal layer is oxidized, and a part, close to the base substrate, of the portion, for forming the first source electrode and the first drain electrode, of the second portion of the metal layer is not oxidized, and wherein in a region corresponding to the first portion of the sacrifice layer, a non-oxidized portion of the metal layer constitutes the first drain electrode and the first source electrode, the portion, covered by the second portion of the sacrifice layer during the second oxidation treatment, of the metal layer constitutes the second drain electrode and the second source electrode, and an oxidized portion of the metal layer constitutes the dielectric layer.

8. The manufacturing method of the array substrate according to claim 7, further comprising: forming the second semiconductor layer on the dielectric layer after removing the second portion of the sacrifice layer, wherein a surface, facing the dielectric layer, of the second semiconductor layer is in direct contact with the second drain electrode and the second source electrode.

9. The manufacturing method of the array substrate according to claim 1, wherein the array substrate comprises:
an operation region, comprising a plurality of operation units arranged in an array, wherein each of the plurality of operation units comprises an operation driving circuit; and
a peripheral region at a periphery of the operation region, wherein the peripheral region is provided with a peripheral driving circuit, and the peripheral driving circuit is configured to drive the operation driving circuit,
wherein the peripheral driving circuit comprises the first thin film transistor, the operation driving circuit comprises the second thin film transistor, and the second thin film transistor is configured to control an operation of each of the plurality of operation units.

10. The manufacturing method of the array substrate according to claim 9, wherein the operation driving circuit further comprises: a storage capacitor, wherein the storage capacitor comprises a first plate and a second plate that are opposite to each other, and the first plate is electrically connected with the second drain electrode,
wherein a same layer is processed to form the first plate, the second source electrode, and the second drain electrode by using the same layer.

11. The manufacturing method of the array substrate according to claim 1, wherein the processing the same layer comprises:
providing a base substrate;
forming a metal layer on the base substrate;
forming a sacrifice layer on the metal layer, the metal layer comprising a first portion not covered by the sacrifice layer and a second portion covered by the sacrifice layer;
performing a first oxidation treatment on the first portion of the metal layer to allow the entire first portion of the metal layer to be completely oxidized;
removing the sacrifice layer; and
performing a second oxidation treatment on the second portion of the metal layer, wherein in a direction perpendicular to the metal layer, a portion, away from the base substrate, of the second portion of the metal layer is oxidized, and a portion, close to the base substrate, of the second portion of the metal layer is not oxidized, and wherein
a non-oxidized portion of the metal layer constitutes the first drain electrode, the first source electrode, and the second gate electrode, and an oxidized portion of the metal layer constitutes the dielectric layer, or,
the non-oxidized portion of the metal layer constitutes the first gate electrode and the second gate electrode, and the oxidized portion of the metal layer constitutes the dielectric layer.

12. The manufacturing method of the array substrate according to claim 11, wherein the dielectric layer is further configured as a gate insulation layer insulating the second semiconductor layer from the second gate electrode.

13. The manufacturing method of the array substrate according to claim 11, wherein a method of the first oxidation treatment comprises at least one selected from a group consisting of an annealing process in air, a plasma oxidation process, an anodic oxidation process, and an ion implantation process, and a method of the second oxidation treatment is the ion implantation process.

14. The manufacturing method of the array substrate according to claim 11, wherein a thickness of the metal layer in a direction perpendicular to the base substrate is in a range of 200 nm to 1000 nm, and the dielectric layer is transparent and insulated.

15. The manufacturing method of the array substrate according to claim 11, wherein a material of the metal layer comprises an elemental metal, and a material of the dielectric layer comprises an oxide of the elemental metal.

16. The manufacturing method of the array substrate according to claim 15, wherein the elemental metal is aluminum, and the oxide of the elemental metal is aluminum oxide.

* * * * *